US009595316B2

(12) United States Patent
Choserot et al.

(10) Patent No.: US 9,595,316 B2
(45) Date of Patent: Mar. 14, 2017

(54) DESIGN-FOR-TEST APPARATUSES AND TECHNIQUES

(71) Applicant: INTEL IP CORPORATION, Santa Clara, CA (US)

(72) Inventors: Vianney Choserot, Antibes (FR); Loubna Hannati, Roquefort les pins (FR); Nabil Badereddine, Grasse (FR); Christophe Chanussot, Antibes (FR)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 14/951,385

(22) Filed: Nov. 24, 2015

(65) Prior Publication Data

US 2016/0078927 A1   Mar. 17, 2016

Related U.S. Application Data

(63) Continuation of application No. 14/207,362, filed on Mar. 12, 2014, now Pat. No. 9,236,144.

(51) Int. Cl.
*G11C 11/00* (2006.01)
*G11C 11/419* (2006.01)
(Continued)

(52) U.S. Cl.
CPC .......... *G11C 11/419* (2013.01); *G11C 11/413* (2013.01); *G11C 11/418* (2013.01);
(Continued)

(58) Field of Classification Search
CPC . G11C 11/419; G11C 11/161; G11C 11/1675; G11C 11/1673; G11C 29/38; G11C 11/16; G11C 13/004; G11C 29/44; G11C 29/50004; G11C 5/147; G11C 29/52; G11C 13/0069; G11C 29/021
(Continued)

(56) References Cited

U.S. PATENT DOCUMENTS 6,590,818 B1 * 7/2003 Liston ................ G11C 29/12
365/188
9,236,144 B2 * 1/2016 Choserot .......... G11C 29/12005
2011/0239062 A1   9/2011 Noda

OTHER PUBLICATIONS

Non-Final Office Action mailed Apr. 15, 2015 for U.S. Appl. No. 14/207,362, 8 pages.
(Continued)

*Primary Examiner* — Thong Q Le
(74) *Attorney, Agent, or Firm* — Schwabe, Williamson & Wyatt, P.C.

(57) ABSTRACT

Embodiments of design-for-test (DFT) apparatuses and related techniques are disclosed herein. In some embodiments, a DFT apparatus may include an SRAM cell, read/write (R/W) circuitry to provide a nominal word line (WL) voltage and a nominal BL voltage for application to the SRAM cell during accesses. The DFT apparatus may also include test circuitry having an activated state and a deactivated state. When the test circuitry is in the activated state, in some embodiments, the WL voltage and/or the BL voltage applied to the SRAM cell may be different from the nominal voltages provided by the R/W/decoder circuitry. The R/W/decoder circuitry may be operated to perform accesses to the SRAM cell while the test circuitry is in the activated state. Other embodiments may be disclosed and/or claimed.

26 Claims, 12 Drawing Sheets

(51) Int. Cl.
*G11C 29/12* (2006.01)
*G11C 29/50* (2006.01)
*G11C 29/54* (2006.01)
*G11C 11/413* (2006.01)
*G11C 11/418* (2006.01)
*G11C 29/44* (2006.01)
G11C 8/08 (2006.01)
G11C 11/41 (2006.01)
G11C 29/18 (2006.01)

(52) U.S. Cl.
CPC ........ *G11C 29/12* (2013.01); *G11C 29/12005* (2013.01); *G11C 29/44* (2013.01); *G11C 29/50* (2013.01); *G11C 29/54* (2013.01); *G11C 8/08* (2013.01); *G11C 11/41* (2013.01); *G11C 2029/1202* (2013.01); *G11C 2029/1802* (2013.01)

(58) Field of Classification Search
USPC ..... 365/158, 154, 148, 201, 189.05, 185.18, 365/189.011, 194, 96, 156, 185.11, 365/189.02, 200, 218, 22
See application file for complete search history.

(56) References Cited

OTHER PUBLICATIONS

Notice of Allowance mailed Aug. 31, 2015 for U.S. Appl. No. 14/207,362, 5 pages.

\* cited by examiner

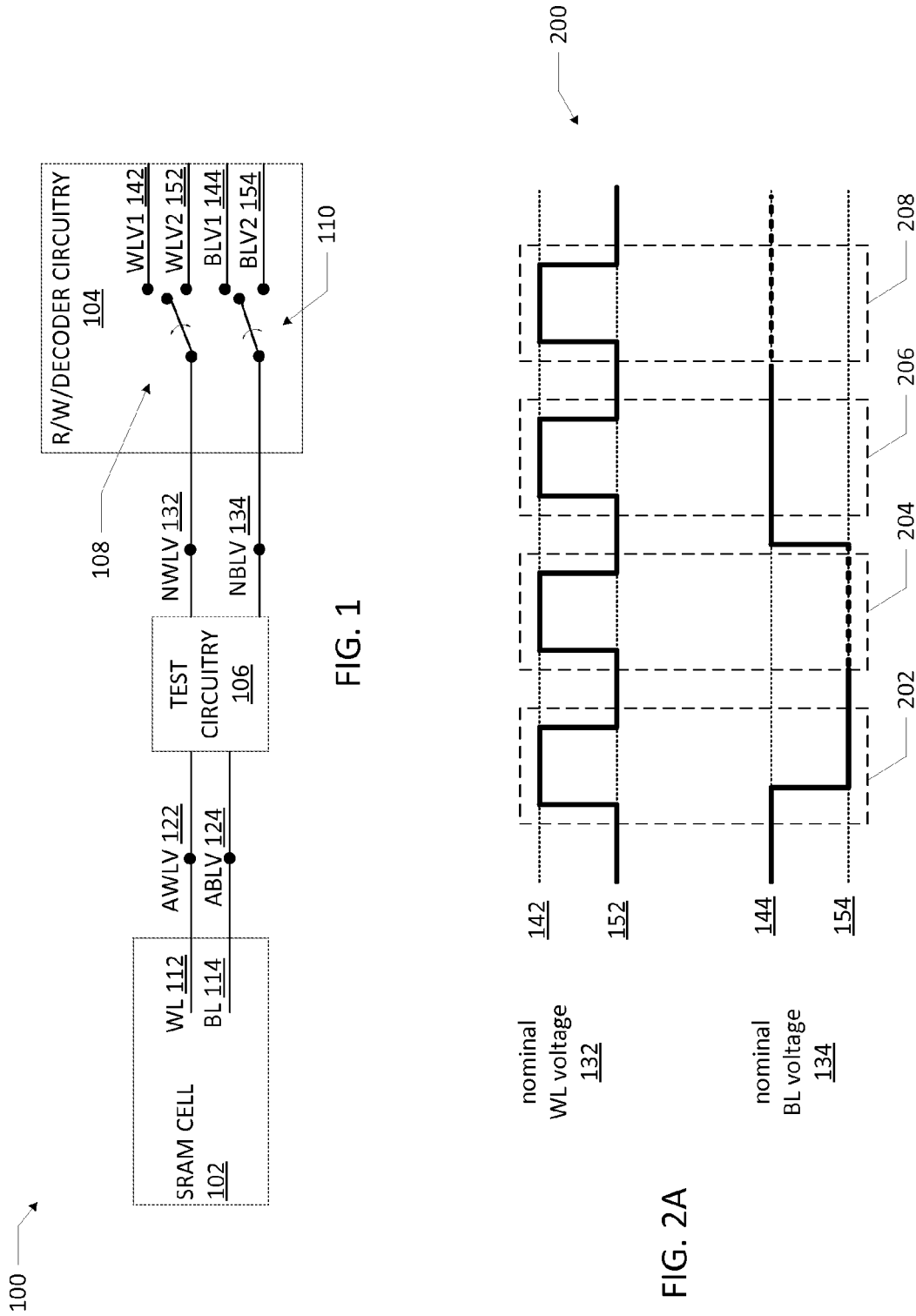

DESIGN-FOR-TEST APPARATUSES AND TECHNIQUES

CROSS-REFERENCE TO RELATED APPLICATIONS

This application is a continuation of U.S. patent application Ser. No. 14/207,362 filed Mar. 12, 2014, which is now U.S. Pat. No. 9,236,144, the entire disclosure of which is incorporated herein by reference.

TECHNICAL FIELD

The present disclosure relates generally to the field of electronic devices, and more particularly, to design-for-test apparatuses and techniques.

BACKGROUND

Electronic devices, such as memory devices, are typically tested by the manufacturer before being shipped to a user. Users may have different performance requirements, and testing must be configured so that the electronic devices meet these requirements. Testing may be costly and time-consuming, however, in some performance requirements have conventionally required test conditions that are burdensome to manufacturers. The result may be electronic devices whose cost is increased due to the difficulty of testing or devices that may not meet the desired performance requirements.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the FIGS. of the accompanying drawings.

FIG. 1 is a block diagram of a DFT apparatus, in accordance with various embodiments.

FIG. 2A is a signaling diagram indicating how read/write/decoder (R/W/decoder) circuitry may selectively provide different voltages as a nominal word line (WL) voltage and/or a nominal bit line (BL) voltage to perform different SRAM accesses, in accordance with various embodiments.

DETAILED DESCRIPTION

Figure 2B:
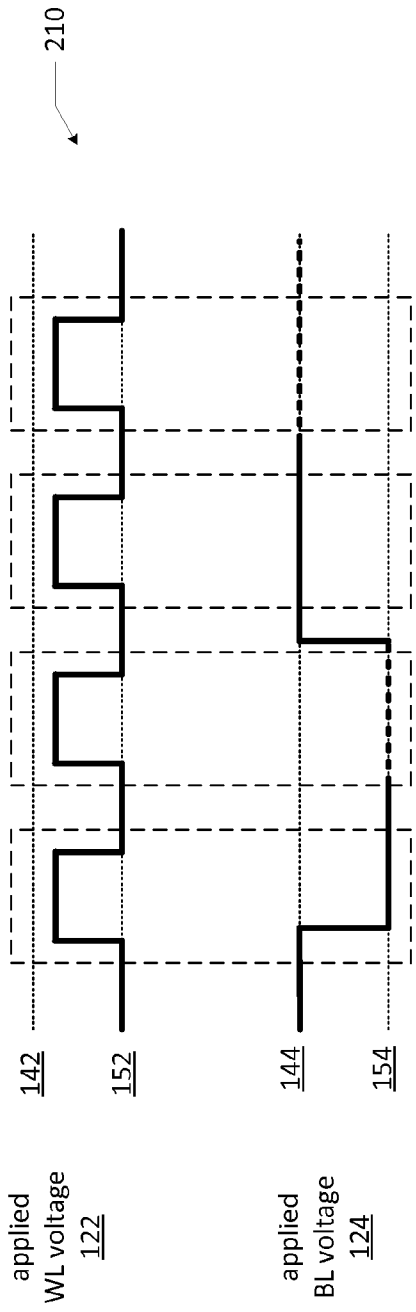
FIG. 2B is a signaling diagram depicting the values of an applied WL voltage and an applied BL voltage, when test circuitry is in an activated state A, during the SRAM accesses discussed with reference to FIG. 2A, in accordance with various embodiments.

Embodiments of design-for-test (DFT) apparatuses and related techniques are disclosed herein. In some embodiments, a DFT apparatus may include a static random access memory (SRAM) cell, read/write/decoder (R/W/decoder) circuitry, and test circuitry. The SRAM cell may have a word line (WL) to receive an applied WL voltage and a bit line (BL) to receive an applied BL voltage. The R/W/decoder circuitry may selectively provide first and second WL voltages for application to the WL during accesses (e.g., during R/W operations), and selectively provide first and second BL voltages for application to the BL during accesses (e.g., during R/W operations). The first WL voltage may be greater than the second WL voltage and the first BL voltage may be greater than the second BL voltage. The test circuitry may be coupled to the SRAM cell and the R/W/decoder circuitry, and may have an activated state and a deactivated state. When the test circuitry is in the deactivated state, (1) when the R/W/decoder circuitry provides the first WL voltage, the applied WL voltage is the first WL voltage, and (2) when the R/W/decoder circuitry provides the second BL voltage, the applied BL voltage is the second BL voltage. When the test circuitry is in the activated state, (1) when the R/W/decoder circuitry provides the first WL voltage, the applied WL voltage is less than the first WL voltage, or (2) when the R/W/decoder circuitry provides the second BL voltage, the applied BL voltage is greater than the second BL voltage. In some embodiments, the DFT apparatus may include power supply circuitry to provide a supply voltage for an array line (AL) of the SRAM cell (e.g., supplying voltage to the core cell array). In some such embodiments, when the test circuitry is in the activated state, the applied AL voltage may be less than the supply voltage.

The DFT apparatuses and related techniques disclosed herein may allow the performance of SRAM cells under various environmental conditions to be simulated at room temperature (e.g., approximately 25 degrees Celsius) by appropriate configuration of the test circuitry. In particular, different activated states of the test circuitry may change the electrical conditions under which the SRAM cell operates in a manner that simulates the effect of different environmental conditions on the operation of the SRAM cell. These different electrical conditions may "stress" an SRAM cell in a manner similar to the stresses caused by certain environmental conditions. Some embodiments disclosed herein provide activated states for test circuitry that simulate the behavior of SRAM cells under different temperature conditions. For example, some of the activated states disclosed herein may be associated with high temperature conditions (e.g., temperature conditions greater than room temperature, such as approximately 50 degrees Celsius or 125 degrees Celsius). Some of the activated states disclosed herein may be associated with low temperature conditions (e.g., temperature conditions less than room temperature, such as of approximately 0 degrees Celsius or −30 degrees Celsius).

Currently, when users set performance requirements for various environmental conditions, manufacturers must use costly test procedures to create these environmental conditions and operate the SRAM cells. When tests of relevant environmental conditions, such as high or low temperatures, are not performed, faulty SRAM cells may not be detected (a situation known as a "fail escape") before the faulty SRAM cells are included in products that are shipped to a user. Examples of fault in SRAM cells that may be relevant to a user include write fails (the failure to write a desired bit to an SRAM cell) and stability fails (the ability of an SRAM cell to hold its value during a read operation), for example. In some embodiments, different kinds of faults may be more prevalent under different terminal conditions. For example, write fails may be more prevalent under low temperature conditions than high temperature conditions. In another example, stability fails may be more prevalent under high temperature conditions than low temperature conditions.

Simulating the behavior of SRAM cells under different environmental conditions without actually having to create those environmental conditions (in accordance with the techniques disclosed herein) may enable enhanced robustness testing of SRAM devices by avoiding the equipment, personnel and time required to set up and test the SRAM devices under the environmental conditions. These costs may be significant; for example, the cost of testing and SRAM device under high temperature conditions may add 30 percent or more to the total cost of test. Reducing the overhead associated with such testing may increase the number and range of tests that may be performed on a given device, which may improve the device's reliability. In particular, the techniques disclosed herein may be advantageously used to screen for high and low temperature fail escapes during production testing at room temperature.

Additionally, when the test circuitry is embedded in a DFT apparatus, testing of the SRAM cells may be performed without having to attach and detach cumbersome external test equipment, enabling the testing of finer features within an SRAM device more rapidly. The DFT apparatuses disclosed herein may monitor an SRAM cell when accessed (e.g., when selected and/or undergoing R/W operations), and may compare the behavior of the SRAM cell against predetermined performance thresholds (e.g., generated by statistical analysis of "good" and/or "bad" SRAM cells) to determine whether or not the monitored SRAM cell is itself "good" or "bad." In some embodiments, the performance characteristics of interest during the monitoring of an SRAM cell under test may be its threshold voltage mismatch profile (e.g., the deviation of an electrical or physical parameter of a transistor-based device due to variations in the manufacturing process). Mismatches, such as threshold voltage mismatches, may be systematic ("global") or random ("local"). In some embodiments, the performance characteristics of interest during the monitoring of an SRAM cell under test may be mismatches other than or in addition to threshold voltage mismatches. The DFT apparatuses disclosed herein may enable the comparison of the threshold voltage mismatch profile of an SRAM cell under test against a voltage mismatch profile of a "good" SRAM cell under the particular environmental condition.

Simulating environmental conditions during SRAM device testing must be performed with care. If a simulation is not well-designed, SRAM cells that would satisfy the performance requirements under actual environmental conditions may fail under the simulated conditions. Moreover, including DFT features in a device incurs area overhead; thus, there may be a trade-off between the potential benefits of DFT features for simulation and the desire to keep devices small. A simulation is most valuable when the failures detected under the simulated conditions are the same failures that would be detected under the actual environmental conditions, with little or no under- or over-detection. Over-detection may be a particularly sensitive issue, as every device erroneously identified as a "bad" device may represent revenues lost and time and resources wasted. For example, a good simulation of an environmental condition may result in an SRAM cell under test exhibiting a threshold voltage mismatch profile that is similar to the threshold voltage mismatch profile of that SRAM cell under the environmental condition.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous. As used herein, the terms "circuitry" or "controller" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable hardware that provide the described functionality.

FIG. 1 is a block diagram of a DFT apparatus 100, in accordance with various embodiments. The DFT apparatus 100 may include an SRAM cell 102, R/W/decoder circuitry 104, and test circuitry 106.

The SRAM cell 102 may have a WL 112 and a BL 114. An exemplary embodiment of the SRAM cell 102 is illustrated below in FIG. 16, but may be arranged in accordance with any known structure for an SRAM cell. The WL 112 may be configured to receive an applied WL voltage 122, and the BL 114 may be configured to receive an applied BL voltage 124. The SRAM cell 102 may also have a complementary bit line (BL_bar), not shown, as is understood in the art and is illustrated in the example SRAM cell 1600 of FIG. 16. The line BL_bar is often omitted from the figures and discussion herein, but this is simply for ease of illustration, and it is to be understood that BL_bar may have an applied BL_bar voltage that is complementary to the applied BL voltage 124, as is conventional. Additionally, the techniques disclosed herein with reference to the BL 114 may be applied in a complementary fashion to the line BL_bar.

In some embodiments, the applied WL voltage 122 and/or the applied BL voltage 124 may be output from the test circuitry 106. In some embodiments, the applied WL voltage 122 and/or the applied BL voltage 124 may be output from the R/W/decoder circuitry 104 in response to interaction between the test circuitry 106 and the R/W/decoder circuitry 104. Various embodiments are discussed in detail below.

The R/W/decoder circuitry 104 may include conventional R/W circuitry and conventional WL decoder circuitry, for example. The R/W circuitry and the WL decoder circuitry may be separate or integrated, in various embodiments. Since the configuration of the R/W/decoder circuitry 14 is conventional, it is not discussed in detail herein. Instead, the R/W/decoder circuitry 104 may be represented figuratively in the accompanying drawings as including one or more "switches" that selectively provide different voltages, as discussed below. It is emphasize that this representation is for ease of illustration and discussion only, and that any conventional R/W and WL decoder circuitry may be included in the R/W/decoder circuitry 104.

The R/W/decoder circuitry 104 may be configured to provide a nominal WL voltage 132. The R/W/decoder circuitry 104 may selectively provide a first WL voltage 142 and a second WL voltage 152 as the nominal WL voltage 132. In particular, the nominal WL voltage 132 may sometimes be equal to the first WL voltage 142 and other times equal to the second WL voltage 152. The first WL voltage 142 may be greater than the second WL voltage 152. For example, in some embodiments, the first WL voltage 142 may be approximately 1 volt and the second WL voltage 152 may be approximately 0 volts. In some embodiments, the first WL voltage 142 may be the supply voltage. Whether the nominal WL voltage 132 is equal to the first WL voltage 142 or the second WL voltage 152 (or another voltage) may be controlled by an R/W WL controller 108. The switch mechanism shown in FIG. 1 is simply illustrative, and any desired control mechanism may be used to change the nominal WL voltage 132.

In some embodiments, the first WL voltage 142 may be equal to a supply voltage of the SRAM cell 102. Supply voltages are discussed in detail below. In some embodiments, the first WL voltage 142 may be less than a supply voltage of the SRAM cell 102. Such embodiments may be referred to as "word line assist" embodiments, and may use a first WL voltage 142 that is less than the supply voltage during accesses to the SRAM cell 102. As discussed below, in some embodiments of the DFT apparatuses and techniques disclosed herein, the applied WL voltage 122 may be reduced below the first WL voltage 142 when the first WL voltage 142 is provided by the R/W/decoder circuitry 104. If the first WL voltage 142 is the supply voltage, the applied WL voltage 122 may be lower than the supply voltage; if the first WL voltage 142 is a value that is lower than the supply voltage (e.g., in word line assist embodiments), the applied WL voltage 122 may be lower than the value.

The R/W/decoder circuitry 104 may also be configured to provide a nominal BL voltage 134. The R/W/decoder circuitry 104 may selectively provide a first BL voltage 144 and a second BL voltage 154 as the nominal BL voltage 134. In particular, the nominal BL voltage 134 may sometimes be equal to the first BL voltage 144 and other times equal to the second BL voltage 154. The first BL voltage 144 may be greater than the second BL voltage 154. For example, in some embodiments, the first BL voltage 144 may be approximately 1 volt and the second BL voltage 154 may be approximately 0 volts. As discussed above with reference to the R/W WL controller 108, the value of the nominal BL voltage 134 may be controlled by an R/W BL controller 110. The switch mechanism shown in FIG. 1 is simply illustrative, and any desired control mechanism may be used to change the nominal BL voltage 134.

The R/W/decoder circuitry 104 may selectively provide different voltages as the nominal WL voltage 132 and/or as the nominal BL voltage 134 in order to perform various R/W operations, in accordance with known techniques. FIG. 2A is a signaling diagram 200 indicating how the R/W/decoder circuitry 104 may selectively provide different voltages as the nominal WL voltage 132 and/or the nominal BL voltage 134 to perform different SRAM accesses, in accordance with various embodiments. As shown in FIG. 2A, the R/W/decoder circuitry 104 may selectively provide a first WL voltage 142 and a second WL voltage 152, the first WL voltage 142 being greater than the second WL voltage 152. Providing the first WL voltage 142 may be referred to as "asserting the word line," while providing the second WL voltage 152 may be referred to as "de-asserting the word line." Providing the first BL voltage 144 may be referred to as "pre-charging the bit line to a 1," while providing the second BL voltage 144 may be referred to as "pre-charging the bit line to a 0." Note that the R/W/decoder circuitry 104 need not always provide a nominal WL voltage 132 and/or a nominal BL voltage 134. For example, the R/W/decoder circuitry 104 may allow the nominal BL voltage 134 to "float" (e.g., during a read operation, as discussed below).

As illustrative examples of R/W operations, FIG. 2A depicts four different signaling combinations 202-208. In 202, the R/W/decoder circuitry 104 may provide the first BL voltage 144, then the second BL voltage 154, as the nominal BL voltage 134 and then may provide the first WL voltage 142 as the nominal WL voltage 132 (after providing the second WL voltage 152). This may cause a value of "0" to be written to the SRAM cell 102, as is conventionally known. In 204, the R/W/decoder circuitry 104 may allow the nominal BL voltage 134 to float while the R/W/decoder circuitry 104 provides the first WL voltage 142 (after providing the second WL voltage 152). This may cause the value of the SRAM cell 102 (in this case, "0") to be read from the SRAM cell 102, as is conventionally known. In 206, the R/W/decoder circuitry 104 may provide this first BL voltage 144 as the nominal BL voltage 134 and then may provide the first WL voltage 142 as the nominal WL voltage 132 (after providing the second WL voltage 152). This may cause a value of "1" to be written to the SRAM cell 102, as is conventionally known. In 208, the R/W/decoder circuitry 14 may allow the nominal BL voltage 134 to float while the R/W/decoder circuitry 14 provides the first WL voltage 142 (after providing the second WL voltage 152). This may cause the value of the SRAM cell 102 (in this case, "1") to be read from the SRAM cell 102, as is conventionally known.

Returning to FIG. 1, the test circuitry 106 may be coupled to the SRAM cell 102 and the R/W/decoder circuitry 104. In some embodiments, the test circuitry 106 may be coupled between the SRAM cell 102 and the R/W/decoder circuitry 104 such that the test circuitry 106 may receive the nominal WL voltage 132 and/or the nominal BL voltage 134 and modify these voltages before they are applied to the SRAM cell 102 as the applied WL voltage 122 and the applied BL voltage 124, respectively. In some embodiments, the test circuitry 106 may provide the applied WL voltage 122 and the applied BL voltage 124 to the WL 112 and the BL 114, respectively, based on the nominal WL voltage 132 and the nominal BL voltage 134, respectively.

The manner in which the test circuitry 106 provides the applied WL voltage 122 and the applied BL voltage 124 based on the nominal WL voltage 132 and the nominal BL voltage 134 may depend on the state of the test circuitry 106. The test circuitry 106 may have a deactivated state and one or more activated states. Each of the states may define a particular relationship between the nominal WL voltage 132 and the applied WL voltage 122 provided by the test circuitry 106 and/or the nominal BL voltage 134 and the applied BL voltage 124 provided by the test circuitry 106. In a deactivated state, the test circuitry 106 may effectively "pass-through" the nominal WL voltage 132 and the nominal BL voltage 134 to the WL 112 and the BL 114, respectively. In activated states, however, the test circuitry 106 may provide an applied WL voltage 122 and/or an applied BL voltage 124 that is different from the nominal WL voltage 132 and/or the nominal BL voltage 134. In some activated states, the values of the applied WL voltage 122 and/or the applied BL voltage 124 provided by the test circuitry 106 may depend on the values of the nominal WL voltage 132 and/or the nominal BL voltage 134.

The test circuitry 106 may include supporting circuitry configured to change the state of the test circuitry 106 in response to control signals. For example, one or more controllers (e.g., one or more microprocessors or other processing devices) may be configured to receive inputs from a human user, the R/W/decoder circuitry 104, the power supply circuitry 118 (discussed below) or any other device that may indicate a desired state for the test circuitry 106 or provide information that may be used by a controller to determine a desired state for the test circuitry 106. In response to such inputs, the test circuitry 106 may adjust its configuration to achieve the desired state. For example, in some embodiments, the test circuitry 106 may include one or more switches controlled by these inputs; when an input indicative of a desired state is received, the switches included in the test circuitry 106 may respond to reconfigure the test circuitry 106 in the desired state (e.g., by coupling various circuitry "into" or "out of" the active signal pathways of the test circuitry 106). A number of examples of circuitry that may be included in the test circuitry 106 in various states are illustrated herein; switches or other techniques may be used to couple these circuits into and out of the test circuitry 106 in response to control signals indicative of the desired state.

In some embodiments, each activated state may correspond to a particular test condition under which accesses to the SRAM cell 102 may be monitored so as to determine whether the SRAM cell 102 meets desired performance requirements. For example, a number of the activated states disclosed herein may provide test conditions for the SRAM cell 102 designed to simulate the operation of the SRAM cell 102 under high or low temperature conditions. By testing the SRAM cell 102 under the different conditions imposed by the test circuitry 106, information about the performance of the SRAM cell 102 under various temperature conditions may be obtained without having to run the SRAM cell 102 under these temperature conditions. As noted above, this may save time, expense, and equipment, and may allow improved performance detection over existing testing techniques. A number of examples of activated states are discussed herein, along with associated performance requirements.

Although only a single SRAM cell 102 (and corresponding R/W/decoder circuitry 104 and test circuitry 106) is illustrated in FIG. 1, the DFT apparatus 100 may include multiple SRAM cells. Each of these SRAM cells may be associated with its own R/W/decoder circuitry 104 (included in the DFT apparatus 100) and/or may share R/W/decoder circuitry with one or more other cells. Each of these SRAM cells may be associated with its own test circuitry 106 (included in the DFT apparatus 100) and/or may share test circuitry with one or more other cells. For example, in some embodiments, approximately 70 percent of SRAM cells in an SRAM device may include associated DFT components. Performance tests performed on multiple SRAM cells included in the DFT apparatus 180 performed in parallel, in series, or in any combination. In some embodiments, all of the SRAM cells included in a DFT apparatus 100 may be tested. In some embodiments, only some of the SRAM cells included in a DFT apparatus 100 may be tested. Consequently, any of the embodiments discussed herein with reference to the DFT apparatus 100 and the SRAM cell 102 may apply to DFT apparatuses having two or more SRAM cells.

Figure 3:
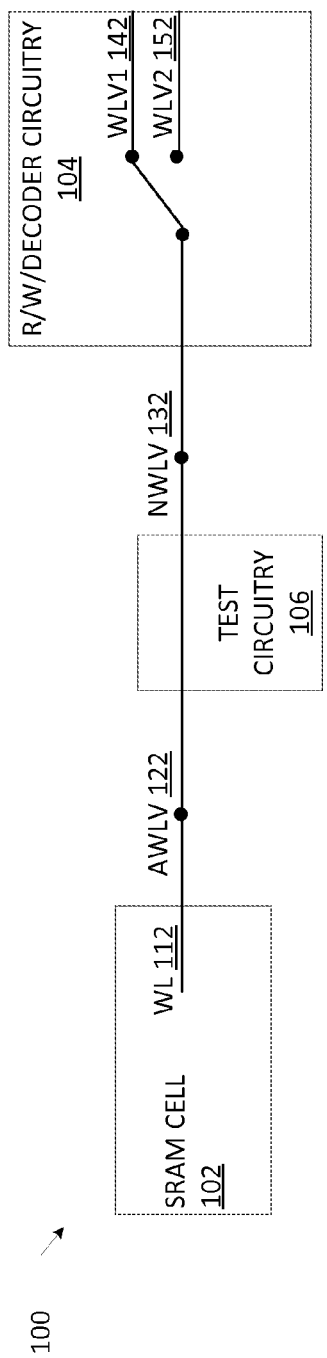
FIGS. 3 and 4 provide block diagrams of portions of a DFT apparatus when test circuitry is in a deactivated state and in the activated state A, respectively, in accordance with various embodiments.
Figure 4:
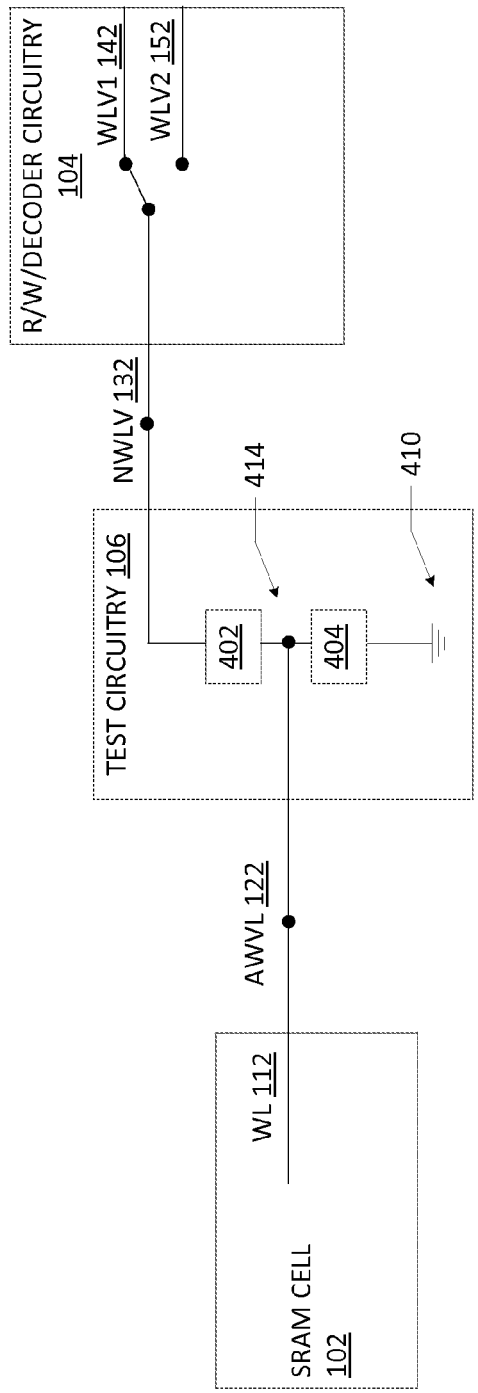

FIGS. 3 and 4 provide block diagrams of portions of the DFT apparatus 100 when the test circuitry 106 is in a deactivated state and in an activated state A, respectively, in accordance with various embodiments. Only certain of the components and signal flow path through the DFT apparatus 100 are depicted in FIGS. 3 and 4 (and other FIGS. discussed herein), but this is simply for clarity of illustration; the components omitted from the FIGS. may be present and may be configured in accordance with the DFT apparatus 100 described above with reference to FIG. 1 or configured otherwise as discussed herein.

In the embodiment depicted in FIGS. 3 and 4, the test circuitry 106 (when in the activated state A) may be configured to provide an applied WL voltage 122 that is less than the nominal WL voltage 132 when the nominal WL voltage 132 is the first WL voltage 142; when in the deactivated state, the test circuitry 106 may be configured to provide an applied WL voltage 122 that is substantially the same as the nominal WL voltage 132. In various embodiments, when the test circuitry 106 is in the activated state A or in the deactivated state, the applied BL voltage 124 may be the nominal BL voltage 134 (e.g., the test circuitry 106 may pass the nominal BL voltage 134 through to the applied BL voltage 124).

In particular, FIG. 3 depicts a portion of the test circuitry 106 in the deactivated state, and illustrates that, when the nominal WL voltage 132 is the first WL voltage 142, the applied WL voltage 122 is the nominal WL voltage 132 (in this case, the first WL voltage 142). In FIG. 3, the test circuitry 106 is depicted as providing a "short circuit" between the nominal WL voltage 132 and the applied WL voltage 122, indicating that the test circuitry 106 does not substantially modify the nominal WL voltage 132 to provide the applied WL voltage 122. In various embodiments of the deactivated state of FIG. 3, when the nominal WL voltage 132 is the second WL voltage 152, the applied WL voltage 122 may be the nominal WL voltage 132 (in this case, the second WL voltage 152) (not illustrated).

FIG. 4 depicts an embodiment of the behavior of portions of the test circuitry 106 in the activated state A, to be contrasted with the deactivated state depicted in FIG. 3 and discussed above. In FIG. 4, an embodiment is depicted in which, when the test circuitry 106 is in the activated state A and the nominal WL voltage 132 is the first WL voltage 142, the applied WL voltage 122 may be less than the nominal WL voltage 132 (in this case, the first WL voltage 142). The difference between the first WL voltage 142 and the applied WL voltage 122 in this context may be any desired value. For example, in some embodiments, the applied WL voltage 122 may be between 0.01 and 0.1 volts less than the first WL voltage 142.

In various embodiments of the activated state A of FIG. 4, when the nominal WL voltage 132 is the second WL voltage 152, the applied WL voltage 122 may be the nominal WL voltage 132 (in this case, the second WL voltage 152) (not illustrated). Thus, the test circuitry 106 in this activated state A may reduce the applied WL voltage 122 from the nominal WL voltage 132 when the nominal WL voltage 132 is the first WL voltage 142, but may not otherwise change the applied WL voltage 122 from the nominal WL voltage 132 (e.g., when the test circuitry 106 is in the deactivated state or when the nominal WL voltage 132 is the second WL voltage 152). FIG. 2B is a signaling diagram 210 depicting the values of the applied WL voltage 122 and the applied BL voltage 124, when the test circuitry 106 is in the activated state A, during the performance of the SRAM accesses discussed above with reference to FIG. 2A, in accordance with various embodiments. As shown in FIG. 2B, the applied WL voltage 122 may be reduced from the nominal WL voltage 132 when the nominal WL voltage 132 is the first WL voltage 142.

In the activated state A, the test circuitry 106 may be configured to provide an applied WL voltage 122 that is less than the first WL voltage 142 in any suitable manner. For example, FIG. 4 depicts an embodiment in which the test circuitry 106 includes a voltage divider arrangement 412. The voltage divider arrangement 412 includes two impedances 402 and 404 connected in series between the nominal WL voltage 132 and a ground 410. As used herein, the term "ground" may refer to any suitable reference voltage (e.g., an earth ground or a voltage different from an earth ground). The voltage at the node 414 between the impedance 402 and the impedance 404 may be less than the nominal WL voltage 132 and may be a function of the values of the impedances 402 and 404, in accordance with known physical principles. The applied WL voltage 122 may be the voltage at the node 414, and thus may be less than the nominal WL voltage 132.

Figure 5:
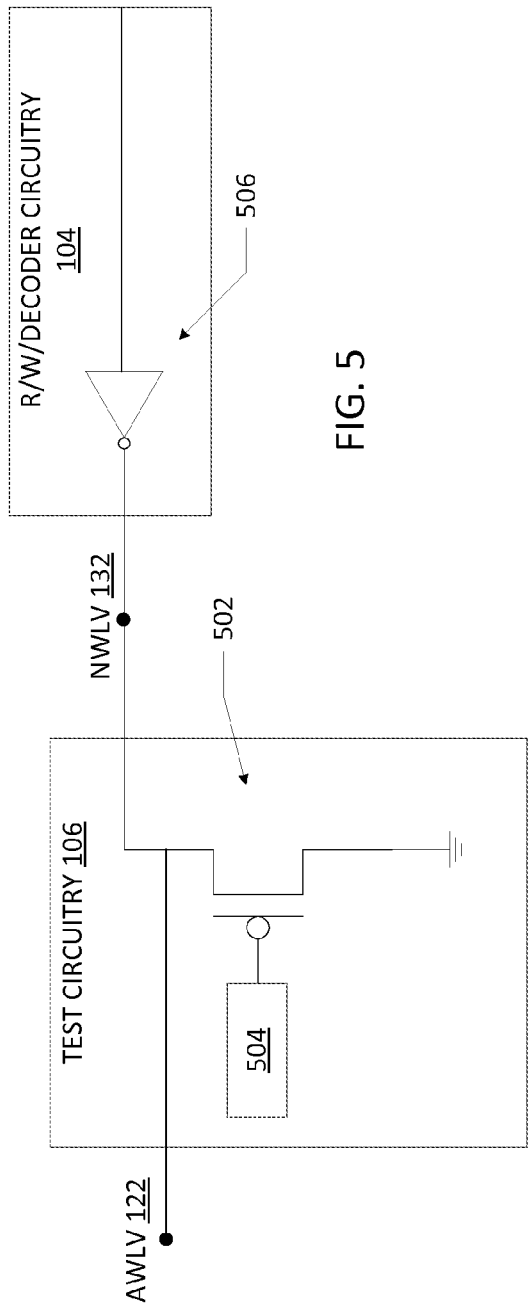
FIG. 5 depicts a particular arrangement that may be included in test circuitry and R/W/decoder circuitry to achieve the deactivated state and the activated state A of FIGS. 3 and 4, in accordance with various embodiments.

Any suitable component providing a desired impedance may be used for the impedances 402 and 404 (e.g., one or more transistors and/or resistors). FIG. 5 depicts a particular arrangement 500 that may be included in the test circuitry 106 and the R/W/decoder circuitry 104 to achieve the deactivated state and the activated state A discussed above with reference to FIGS. 3 and 4, in accordance with various embodiments. In FIG. 5, the R/W/decoder circuitry 104 may include a WL buffer 506. The output of the WL buffer 506 may provide the nominal WL voltage 132. The test circuitry 106 may include a transistor 502 coupled between the nominal WL voltage 132 and a ground 510. The gate of the transistor 502 may be controlled by a transistor controller 504, which may be configured to receive inputs indicative of the desired state of the test circuitry 106 and provide various voltages to the gate of the transistor 502 to "open" and "close" the transistor 502 to current flow between the output of the WL buffer 506 and the ground 510. When the transistor 502 is open, the applied WL voltage 122 may be equal to the nominal WL voltage 132; when the transistor 502 is closed, the applied WL voltage 122 may be less than the nominal WL voltage 132. The transistor controller 504 may be configured to open the transistor 502 in response to inputs indicating that the test circuitry 106 is to be in the deactivated state or inputs indicating that the nominal WL voltage 132 is the second WL voltage 152. The transistor controller 504 may be configured to close the transistor 502 in response to inputs indicating that the test circuitry 106 is to be in the activated state A and that the nominal WL voltage is the first WL voltage 142.

This activated state A may be particularly advantageous in simulating low temperature conditions (e.g., temperatures of approximately zero degrees Celsius, or other low temperatures). In some embodiments, the threshold voltage mismatch profile of an SRAM cell when the test circuitry 106 is in the activated state A may be closer to the threshold voltage mismatch profile of an SRAM cell under low temperature conditions than conventional simulation procedures. In particular, write fails under low temperature conditions may be advantageously detected when the test circuitry 106 is in the activated state A. Thus, in some embodiments, SRAM accesses performed and/or monitored when the test circuitry 106 is in the activated state A may be entirely or predominantly write operations (to monitor for write fails).

Figure 6:
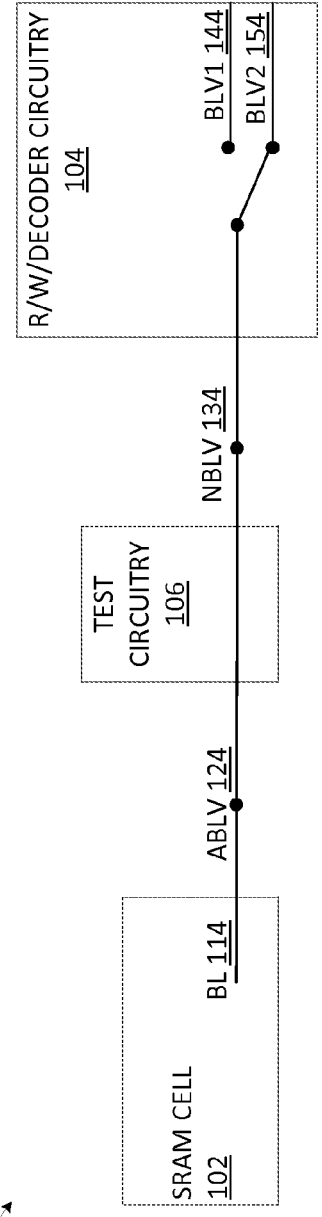
FIGS. 6 and 7 provide block diagrams of portions of a DFT apparatus when test circuitry is in a deactivated state and in the activated state B, respectively, in accordance with various embodiments.
Figure 7:
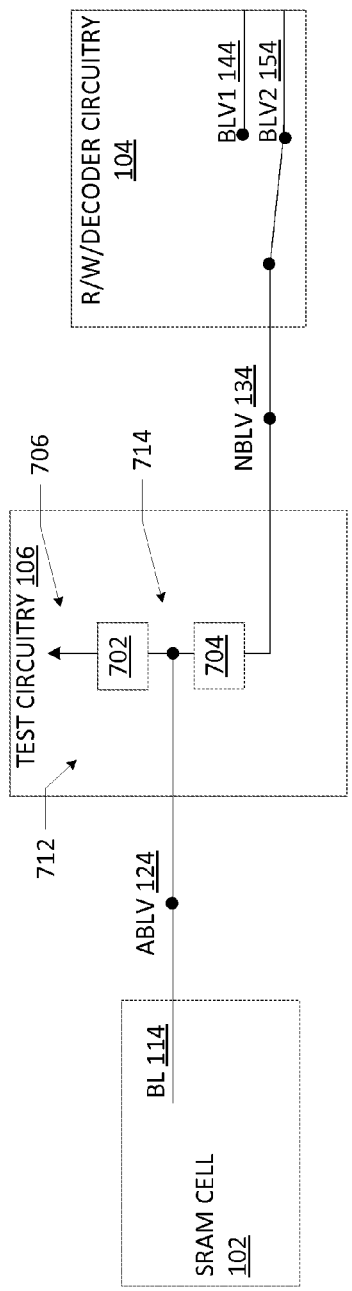

FIGS. 6 and 7 provide block diagrams of portions of the DFT apparatus 100 when the test circuitry 106 is in a deactivated state and in an activated state B, respectively, in accordance with various embodiments.

In the embodiment depicted in FIGS. 6 and 7, the test circuitry 106 (when in the activated state B) may be configured to provide an applied BL voltage 124 that is greater than the nominal BL voltage 134 when the nominal BL voltage 134 is the second WL voltage 154; when in the deactivated state, the test circuitry 106 may be configured to provide an applied BL voltage 124 that is substantially the same as the nominal BL voltage 134. In various embodiments, when the test circuitry 106 is in the activated state B or in the deactivated state, the applied WL voltage 122 may be the nominal WL voltage 132 (e.g., the test circuitry 106 may pass the nominal WL voltage 132 through to the applied WL voltage 122).

In particular, FIG. 6 depicts the test circuitry 106 in the deactivated state, and illustrates that, when the nominal BL voltage 134 is the second BL voltage 154, the applied BL voltage 124 is the nominal BL voltage 134 (in this case, the second BL voltage 154). In FIG. 6, the test circuitry 106 is depicted as providing a "short circuit" between the nominal BL voltage 134 and the applied BL voltage 124, indicating that the test circuitry 106 does not substantially modify the nominal BL voltage 134 to provide the applied BL voltage 124. In various embodiments of the deactivated state of FIG. 6, when the nominal BL voltage 134 is the first BL voltage 144, the applied BL voltage 124 may be the nominal BL voltage 134 (in this case, the first BL voltage 144) (not illustrated).

FIG. 7 depicts an embodiment of the behavior of portions of the test circuitry 106 in the activated state B, to be contrasted with the deactivated state depicted in FIG. 6 and discussed above. In FIG. 7, an embodiment is depicted in which, when the test circuitry 106 is in the activated state B and the nominal BL voltage 134 is the second BL voltage 154, the applied BL voltage 124 may be greater than the nominal BL voltage 134 (in this case, the second BL voltage 154). The difference between the second BL voltage 154 and the applied BL voltage 124 in this context may be any desired value. For example, in some embodiments, the applied BL voltage 124 may be between 0.01 and 0.15 volts greater than the second BL voltage 154.

Figure 2C:
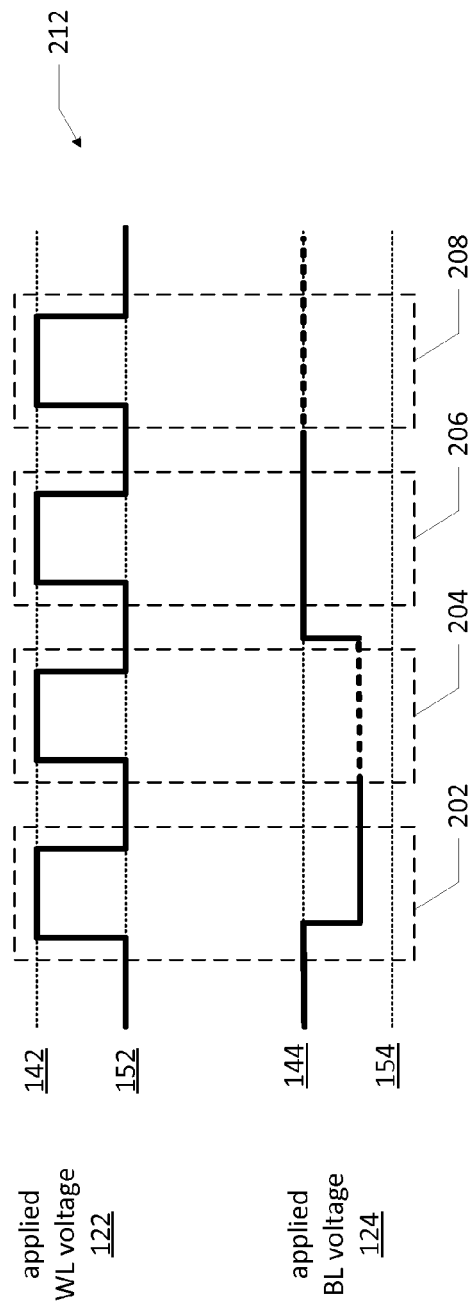
FIG. 2C is a signaling diagram depicting the values of an applied WL voltage and an applied BL voltage, when test circuitry is in an activated state B, during the SRAM accesses discussed with reference to FIG. 2A, in accordance with various embodiments.

In various embodiments of the activated state B of FIG. 7, when the nominal BL voltage 134 is the first BL voltage 144, the applied BL voltage 124 may be the nominal BL voltage 134 (in this case, the first BL voltage 144) (not illustrated). Thus, the test circuitry 106 in this activated state B may increase the applied BL voltage 124 from the nominal BL voltage 134 when the nominal BL voltage 134 is the second BL voltage 154, but may not otherwise change the applied BL voltage 124 from the nominal BL voltage 134 (e.g., when the test circuitry 106 is in the deactivated state or when the nominal BL voltage 134 is the first BL voltage 144). FIG. 2C is a signaling diagram 212 depicting the values of the applied WL voltage 122 and the applied BL voltage 124, when the test circuitry 106 is in the activated state B, during the performance of the SRAM accesses discussed above with reference to FIG. 2A, in accordance with various embodiments. As shown in FIG. 2C, the applied BL voltage 124 may be greater than the nominal BL voltage 134 when the nominal BL voltage 134 is the second BL voltage 154.

In the activated state B, the test circuitry 106 may be configured to provide an applied BL voltage 124 that is greater than the second BL voltage 154 in any suitable manner. For example, FIG. 7 depicts an embodiment in which the test circuitry 106 includes a voltage divider arrangement 712. The voltage divider arrangement 712 includes two impedances 702 and 704 connected in series between the nominal BL voltage 134 and a high reference voltage 706. The high reference voltage 706 may take any suitable value (e.g., the value of a supply voltage, as discussed below). For example, the high reference voltage 706 may be 1 volt or 0.8 volts. The voltage at the node 714 between the impedance 702 and the impedance 704 may be greater than the nominal BL voltage 134 and may be a function of the values of the impedances 702 and 704, in accordance with known physical principles. The applied BL voltage 124 may be the voltage at the node 714, and thus may be greater than the nominal BL voltage 134.

Figure 8:
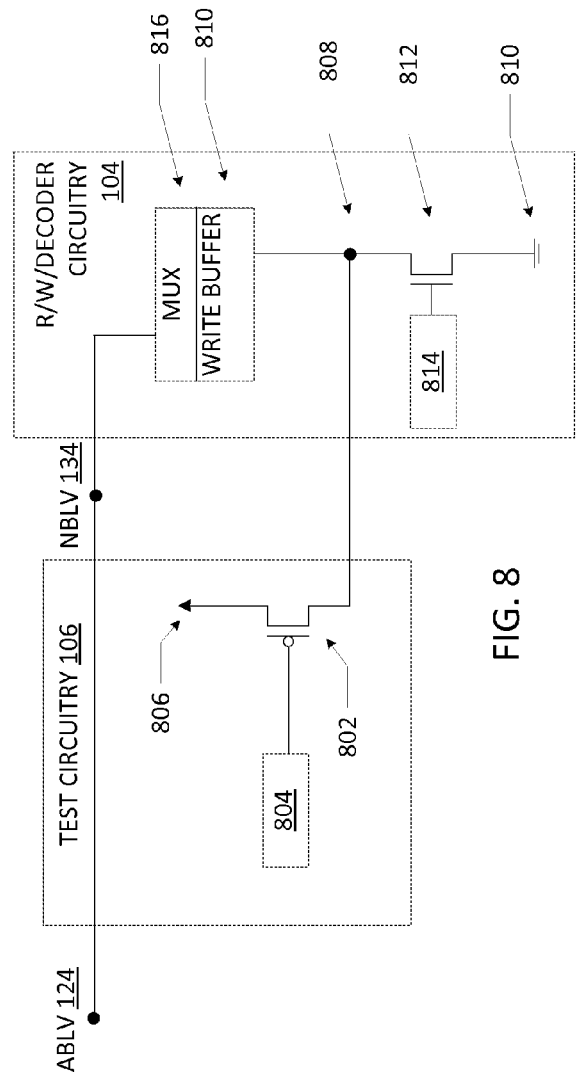
FIG. 8 depicts a particular arrangement that may be included in test circuitry and R/W/decoder circuitry to achieve the deactivated state and the activated state B of FIGS. 6 and 7, in accordance with various embodiments.

As discussed above with reference to FIG. 4, any suitable component providing a desired impedance may be used for the impedances 702 and 704 (e.g., one or more transistors and/or resistors). FIG. 8 depicts a particular arrangement 800 that may be included in the test circuitry 106 and the R/W/decoder circuitry 104 to achieve the deactivated state and the activated state B discussed above with reference to FIGS. 6 and 7, in accordance with various embodiments. In FIG. 8, the R/W/decoder circuitry 104 may include a write buffer 810 and a multiplexer (MUX) 816. The output of the 816 MUX may provide the nominal BL voltage 134. The R/W/decoder circuitry 104 may also include a transistor 812 coupled between an input 808 of the write buffer 810 and a ground 820. The gate of the transistor 812 may be controlled by a transistor controller 814, which may be configured to receive inputs indicative of the desired voltage to be applied to the input 808 of the write buffer 810 and provide various voltages to the gate of the transistor 812 to open and close the transistor 812 to current flow between the input 808 of the write buffer 810 and the ground 820. For ease of discussion, the nominal BL voltage 134 will be discussed as being equal to the voltage at the input 808 of the write buffer 810.

The test circuitry 106 may also include a transistor 802 coupled between the input 808 of the write buffer 810 and a high reference voltage 806. The gate of the transistor 802 may be controlled by a transistor controller 804, which may be configured to receive inputs indicative of the desired state of the test circuitry 106 and provide various voltages to the gate of the transistor 802 to open and close the transistor 802 to current flow between the input 808 of the write buffer 810 and the high reference voltage 806. In particular, the transistor 812 may be opened in the deactivated state and may be closed in the activated state B.

When the transistor 802 is open (deactivated state), and the transistor 812 of the R/W/decoder circuitry 104 is open, the voltage at the input 808 may be a value between the high reference voltage 806 and the ground 820. This value may be based on the impedances of the open transistors 802 and 812, in accordance with known physical principles for voltage dividers, and may serve as the first BL voltage 144. When the transistor 802 is open (deactivated state), and the transistor 812 is closed, the voltage at the input 808 may be "pulled down" toward the ground 820. This voltage at the input 808 may be the second BL voltage 154. However, when the transistor 802 is closed (activated state B), and the transistor 812 of the R/W/decoder circuitry 104 is closed, the voltage at the input 808 may be "pulled up" toward the high reference voltage 806. This pulled up voltage may be the applied BL voltage 124 in the activated state B and may be greater than the second BL voltage 154. Thus, in the embodiment of FIG. 8), the test circuitry 106 interacts with the R/W/decoder circuitry 104 to adjust the applied BL voltage 124 as a function of the states of the test circuitry 106.

This activated state B may be particularly advantageous in simulating low temperature conditions (e.g., temperatures of approximately zero degrees Celsius, or other low temperatures). In some embodiments, the threshold voltage mismatch profile of an SRAM cell when the test circuitry 106 is in the activated state B may be closer to the threshold voltage mismatch profile of an SRAM cell under low temperature conditions than conventional simulation procedures. In particular, write fails under low temperature conditions may be advantageously detected when the test circuitry 106 is in the activated state B. Thus, in some embodiments, SRAM accesses performed and/or monitored when the test circuitry 106 is in the activated state B may be entirely or predominantly write operations (to monitor for write fails).

In some embodiments, the SRAM cell 102 may be tested for low temperature performance when the test circuitry 106 is in the activated state A (discussed above with reference to FIGS. 3-5) and/or in the activated state B. Depending upon the architecture of the SRAM cell 102, one of the activated state A and the activated state B may be more suitable for testing performance under low temperature conditions; the appropriate techniques may be selected by examining voltage threshold mismatch profiles, for example and selecting the technique that provides the profile most near to the experimentally determined profile. In some embodiments, both techniques may be used to test the SRAM cell 102.

Figure 9:
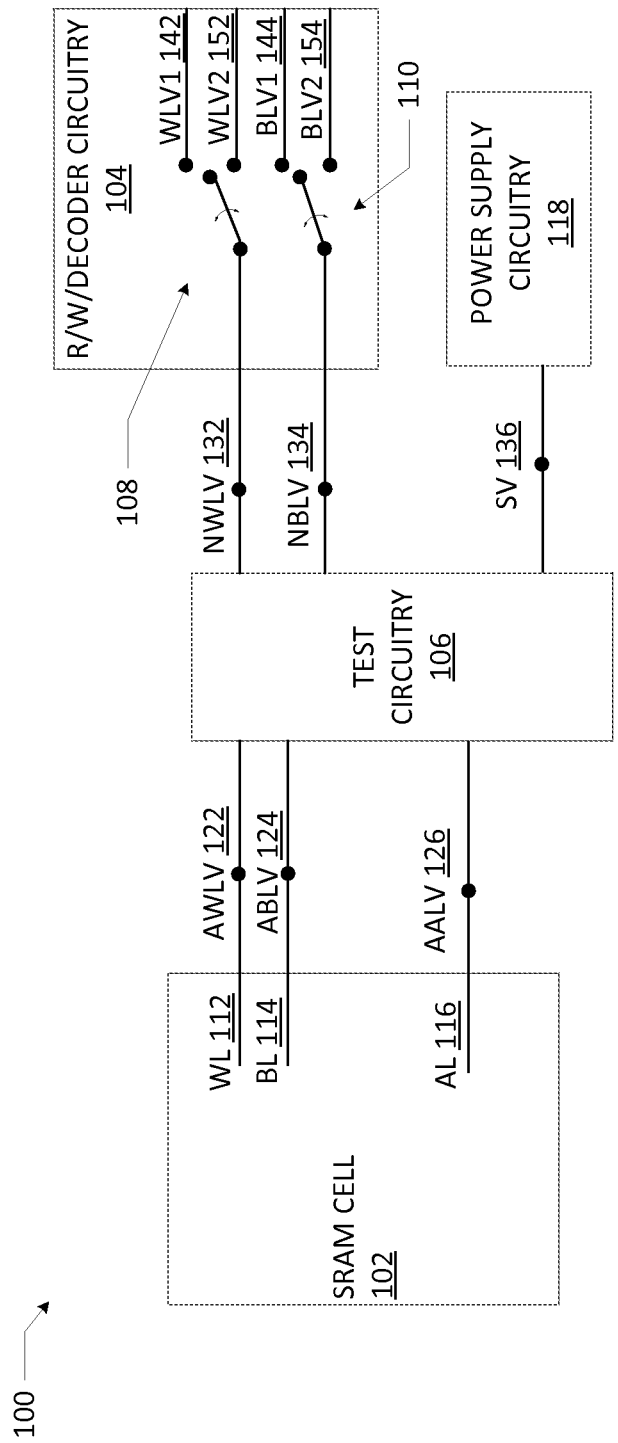
FIG. 9 is a block diagram of a DFT apparatus including power supply circuitry coupled to test circuitry, in accordance with various embodiments.

In some embodiments, the test circuitry 106 may be configured to modify the applied array line (AL) voltage provided to the SRAM cell 102 from nominal AL voltage values provided by power supply circuitry in various states. FIG. 9 is a block diagram of the DFT apparatus 100 including power supply circuitry 118 coupled to the test circuitry 106, in accordance with various embodiments. As shown, the DFT apparatus 100 of FIG. 9 may include all of the components discussed above with reference to FIG. 1, and may additionally include the power supply circuitry 118 and related components.

In particular, the SRAM cell 102 may include an AL 116. The AL may be configured to receive an applied AL voltage 126. In some embodiments, the applied AL voltage 126 may be output from the test circuitry 106. In some embodiments, the applied AL voltage 126 may be output from the power supply circuitry 118 in response to interaction between the test circuitry 106 and the power supply circuitry 118.

The power supply circuitry 118 may be configured to provide a supply voltage 136. The power supply circuitry 118 may include one or more switches are other components to selectively provide the supply voltage 136 (e.g., an "ON/OFF" switch).

In some embodiments, the test circuitry 106 may be coupled between the SRAM cell 102 and the power supply circuitry 118 such that the test circuitry 106 may receive the supply voltage 136 and modify this voltage before it is applied to the SRAM cell 102 as the applied AL voltage 126. In some embodiments, the test circuitry 106 may provide the applied AL voltage 126 to the AL 116 based on the supply voltage 136. The manner in which the test circuitry 106 provides the applied AL voltage 126 based on the supply voltage 136 may depend on the state of the test circuitry 106, as analogously discussed above with reference to provision of the applied WL voltage 122 and the applied BL voltage 124. For example, each of the states of the test circuitry 106 may define a particular relationship between the supply voltage 136 and the applied AL voltage 126 provided by the test circuitry.

In a deactivated state, the test circuitry 106 may effectively "pass-through" the supply voltage 136 to the AL 116. Thus, in a deactivated state, the test circuitry 106 may pass the nominal WL voltage 132, the nominal BL voltage 134 and the supply voltage 136 through to the applied WL voltage 122, applied BL voltage 124 and the applied AL voltage 126, respectively. In some activated states, however, the test circuitry 106 may provide an applied AL voltage 126 that is different from the supply voltage 136. In some activated states, the values of the applied AL voltage 122 126 provided by the test circuitry 106 may depend on the values of the supply voltage 136.

Modification of the applied AL voltage from nominal AL voltage values may be performed independently of or in conjunction with the other examples of activated state disclosed herein. For example, in some activated states of the test circuitry 106, the applied WL voltage 122 and/or the applied BL voltage 124 may differ from the nominal WL voltage 132 and/or the nominal BL voltage 134, respectively, and the applied AL voltage 126 may differ from the supply voltage 136. A number of such combinations are explicitly discussed herein, but other suitable combinations are contemplated.

Figure 10:
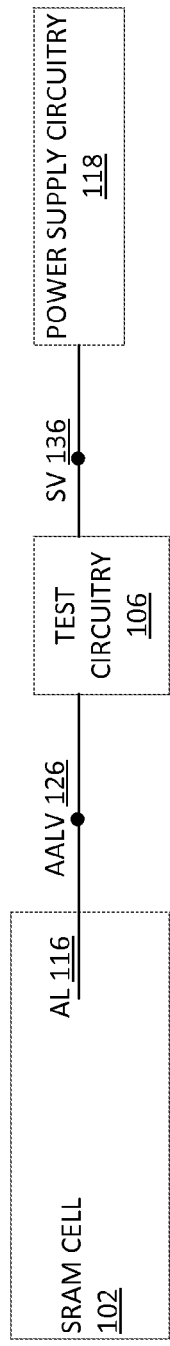
FIGS. 10 and 11 provide block diagrams of the DFT apparatus 100 when the test circuitry 106 is in a deactivated state and in an activated state C, respectively, in accordance with various embodiments.
Figure 11:
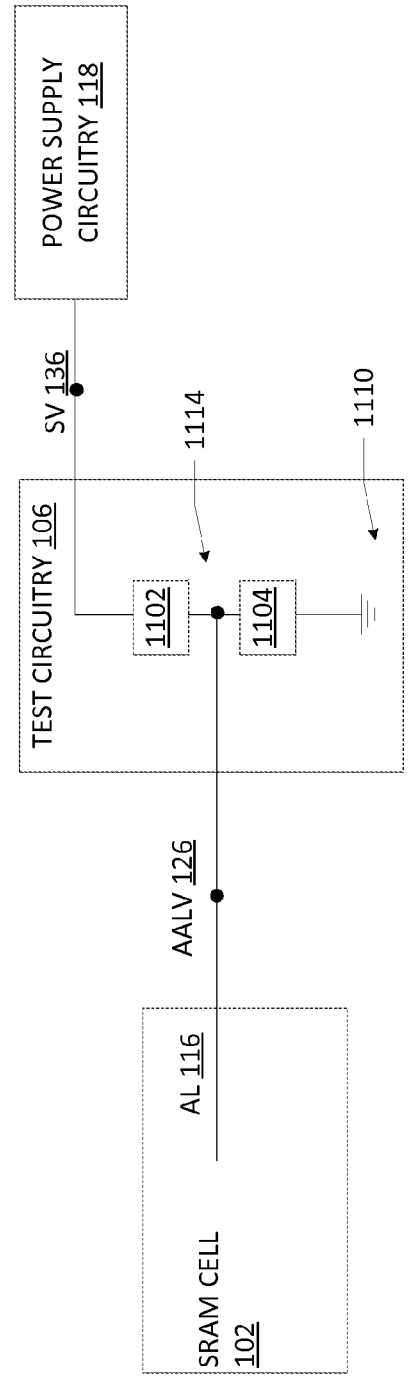

FIGS. 10 and 11 provide block diagrams of portions of the DFT apparatus 100 when the test circuitry 106 is in a deactivated state and in an activated state C, respectively, in accordance with various embodiments. In the embodiment depicted in FIGS. 10 and 11, the test circuitry 106 (when in the activated state C) may be configured to provide an applied AL voltage 126 that is less than the supply voltage 136; when in the deactivated state, the test circuitry 106 may be configured to provide an applied AL voltage 126 that is substantially the same as the supply voltage 136. The difference between the supply voltage 136 and the applied AL voltage 126 when the test circuitry 106 is in the activated state C may be any desired value. For example, in some embodiments, the applied AL voltage 126 may be between 0.05 and 0.15 volts less than the supply voltage 136. In various embodiments, when the test circuitry 106 is in the activated state C or in the deactivated state, the applied WL voltage 122 may be the nominal WL voltage 132 (e.g., the test circuitry 106 may pass the nominal WL voltage 132 through to the applied WL voltage 122) and the applied BL voltage 124 may be the nominal BL voltage 134 (e.g., the test circuitry 106 may pass the nominal BL voltage 134 through to the applied BL voltage 124).

In particular, FIG. 10 depicts the test circuitry 106 in the deactivated state, and illustrates that the applied AL voltage 126 is the supply voltage 136. In FIG. 10, the test circuitry 106 is depicted as providing a "short circuit" between the supply voltage 136 and the applied AL voltage 126, indicating that the test circuitry 106 does not substantially modify the supply voltage 136 to provide the applied AL voltage 126.

FIG. 11 depicts an embodiment of the behavior of the test circuitry 106 in the activated state C, to be contrasted with the deactivated state depicted in FIG. 10 and discussed above. In FIG. 11, an embodiment is depicted in which, when the test circuitry 106 is in the activated state C, the applied AL voltage 126 may be less than the supply voltage 136.

The test circuitry 106 may be configured to provide an applied AL voltage 126 that is less than the supply voltage 136 in any suitable manner. For example, FIG. 11 depicts an embodiment in which the test circuitry 106 includes a voltage divider arrangement 1112. The voltage divider arrangement 1112 includes two impedances 1102 and 1104 connected in series between the supply voltage 136 and a ground 1110. As discussed above with reference to FIG. 4, the voltage at the node 1114 between the impedance 1102 and the impedance 1104 may be less than the supply voltage 136 and may be a function of the values of the impedances 1102 and 1104, in accordance with known physical principles. The applied AL voltage 126 may be the voltage at the node 1114, and thus may be less than the supply voltage 136.

Figure 12:
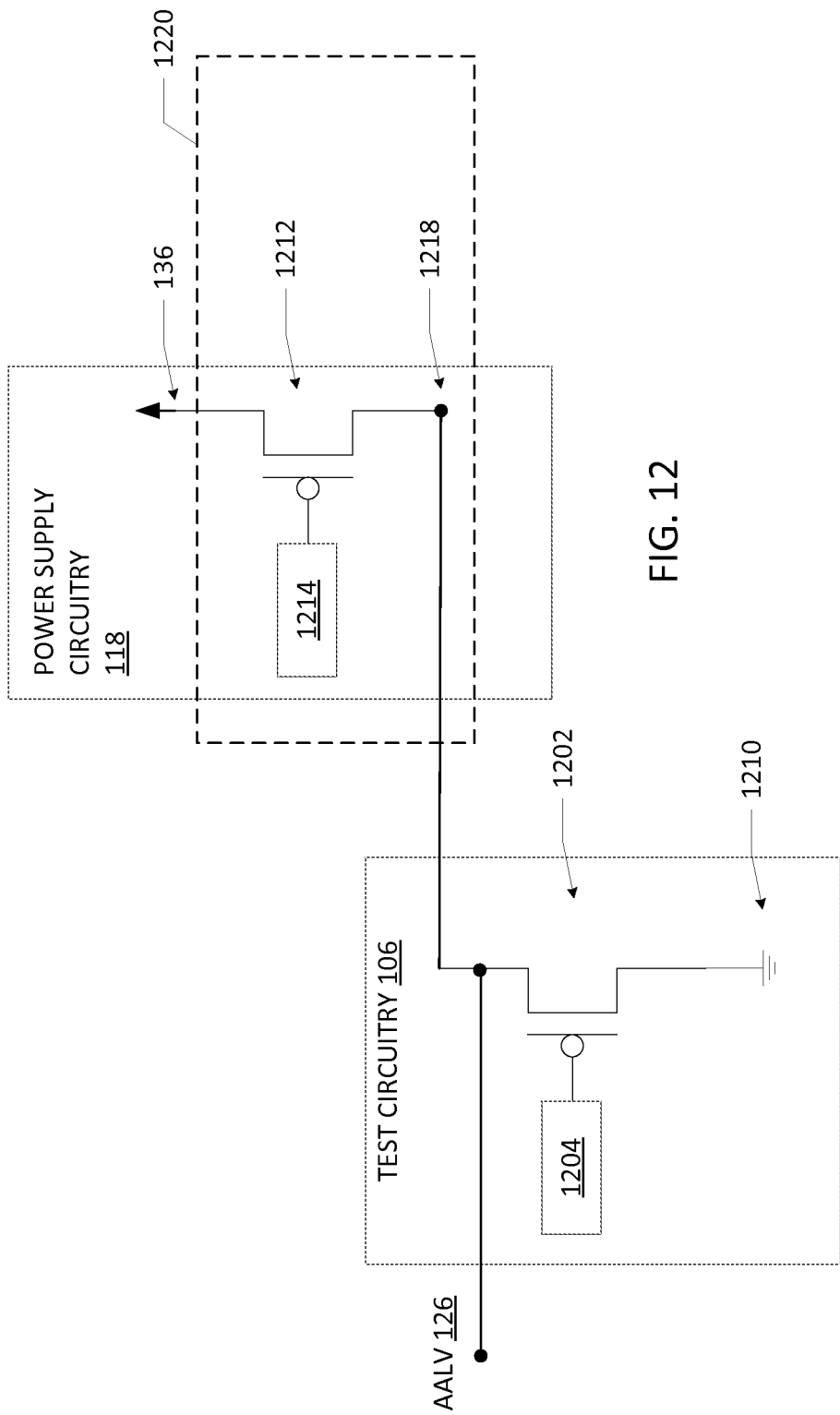
FIG. 12 depicts a particular arrangement that may be included in test circuitry and power supply circuitry to achieve the deactivated state and the activated state C of FIGS. 10 and 11, in accordance with various embodiments.

Any suitable component providing a desired impedance may be used for the impedances 1102 and 1104 (e.g., one or more transistors and/or resistors). FIG. 12 depicts a particular arrangement 1200 that may be included in the test circuitry 106 and the power supply circuitry 118 to achieve the deactivated state and the activated state C discussed above with reference to FIGS. 10 and 11, in accordance with various embodiments. In FIG. 12, the power supply circuitry 118 may include the supply voltage 136 and a transistor 1212 coupled between the power source voltage 1206 and a node 1218 from which the applied AL voltage 126 may be provided. The gate of the transistor 1212 may be controlled by a transistor controller 1214. The transistor 1212 and the transistor controller 1214 may act as a power switch 1220, controlling the provision of the supply voltage 136 to the applied AL voltage 126. In particular, the transistor controller 1214 may be configured to receive inputs indicative of whether power is to be supplied to the SRAM cell 102 (via the AL 116) and to provide various voltages to the gate of the transistor 1212 to "open" and "close" the transistor 1212 to current flow between the power source voltage 1206 and the AL 116. When the transistor 1212 is open, the power switch 1220 may be "off"; when the transistor 1212 is closed, the power switch 1220 may be "on." Further discussion will focus on applications in which the power switch 1220 is on.

The test circuitry 106 may include a transistor 1202 coupled between the power switch 1220 and a ground 1210. The test circuitry 106 may also include a transistor controller 1204, which may control the gate of the transistor 1202. The transistor controller 1204 may be configured to receive inputs indicative of the desired state of the test circuitry 106 and to provide various voltages to the gate of the transistor 1202 to "open" and "close" the transistor 1202 to current flow between the power switch 1220 and the ground 1210. In particular, the transistor 1202 may be open in the deactivated state and closed in the activated state C.

When the transistor 1202 is open (the deactivated state), the applied AL voltage 126 will be the supply voltage 136. When the transistor 1202 is closed (the activated state C), the applied AL voltage 126 will be pulled down towards the ground 1210, and will be less than the supply voltage 136.

Modification of the applied AL voltage from the supply voltage may be performed independently of or in conjunction with the other examples of activated states disclosed herein. A number of such combinations are explicitly discussed herein, but other suitable combinations are contemplated.

For example, in some embodiments, an activated state D of the test circuitry 106 may include the reduction of the applied AL voltage 126 relative to the supply voltage 136 (e.g., as discussed above with reference to FIGS. 10-11) and the reduction of the applied WL voltage 122 from the nominal WL voltage 132 when the nominal WL voltage 132 is the first WL voltage 142 (e.g., as discussed above with reference to FIGS. 3-5). This activated state D may be particularly advantageous in simulating high temperature conditions (e.g., temperatures of approximately 125 degrees Celsius, or other high temperatures). In some embodiments, the threshold voltage mismatch profile of an SRAM cell when the test circuitry 106 is in the activated state D may be closer to the threshold voltage mismatch profile of an SRAM cell under high temperature conditions than conventional simulation procedures. In particular, stability fails under high temperature conditions may be advantageously detected when the test circuitry 106 is in the activated state D. Thus, in some embodiments, SRAM accesses performed and/or monitored when the test circuitry 106 is in the activated state D may be entirely or predominantly read operations (to monitor for stability fails).

In the activated states A and B of the test circuitry 106, the applied AL voltage 126 may be approximately equal to the supply voltage 136 (e.g., not reduced from the supply voltage 136 as discussed above with reference to the activated state D).

Figure 13:
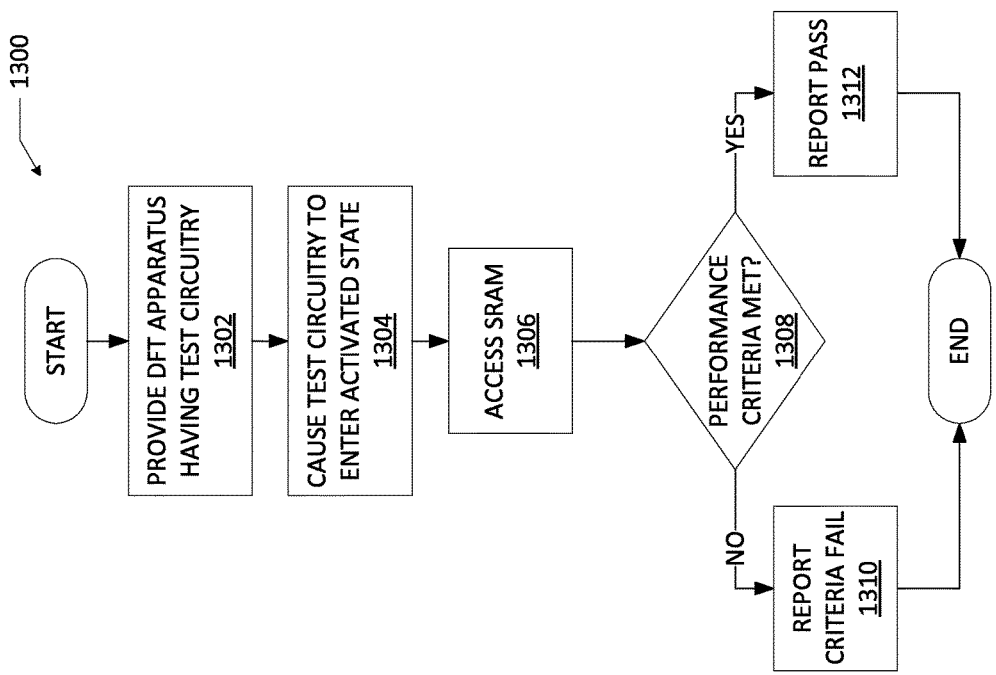
FIG. 13 is a flow diagram of an illustrative process for operating a DFT apparatus, in accordance with various embodiments.

FIG. 13 is a flow diagram of an illustrative process 1300 for operating a DFT apparatus, in accordance with various embodiments. The process 1300 (and other processes disclosed herein) may be discussed below with reference to the DFT apparatus 100, but this is simply for ease of illustration; any suitable apparatus may be the subject of the process 1300. Additionally, the process 1300 (and other processes disclosed herein) may be discussed with reference to the SRAM cell 102, but as noted above, the DFT apparatus 100 may include multiple SRAM cells, all or some of which may be tested in parallel and/or in series.

The process 1300 may begin at 1302, at which the DFT apparatus 100 may be provided. The DFT apparatus 100 provided at 1302 may include an SRAM cell 102, the R/W/decoder circuitry 104, and the test circuitry 106 (coupled to the SRAM cell 102 and the R/W/decoder circuitry 104). The DFT apparatus 100 may also include the power supply circuitry 118. In some embodiments, the DFT apparatus 100 may be provided by coupling the power supply circuitry 118 to a power source.

At 1304, the test circuitry 106 of the DFT apparatus 100 may be caused to enter an activated state. In some embodiments, the activated state of the test circuitry 106 may be the activated state A discussed above with reference to FIGS. 3-5. In some embodiments, the activated state of the test circuitry 106 may be the activated state B discussed above with reference to FIGS. 6-8. In some embodiments, the activated state of the test circuitry 106 may be the activated state D discussed above. The DFT apparatus 100 may be caused enter the activated state at 1304 by providing appropriate input signals to the test circuitry 106 (e.g., to one or more transistor controller included in the test circuitry 106).

At 1306, the SRAM cell 102 may be accessed while the test circuitry 106 is in the activated state of 1304. Accesses to the SRAM cell 102 may include raising and/or lowering the WL 112 and/or raising and/or lowering the BL 114 (e.g., to perform one or more read or write operations). In some embodiments, while the SRAM cell 102 is accessed at 1306 (or afterwards), the accesses may be monitored to determine whether a bit stored in the SRAM cell 102 is correctly read and/or a new bit is correctly written to the SRAM cell 102. Control of the R/W/decoder circuitry 104 at 1306 may be performed by conventional R/W techniques or other SRAM control techniques, and thus is not discussed further.

At 1308, the SRAM accesses of 1306 may be monitored and compared to performance criteria. Monitoring for errors may include counting read and/or write errors, categorizing errors, statistically analyzing SRAM behavior, or comparing any of these to a threshold that divides the performance of acceptable SRAM cells from the performance of unacceptable SRAM cells. In some embodiments, multiple SRAM cells may be monitored for errors, in the monitoring may include aggregating errors over multiple SRAM cells and comparing these aggregate errors to performance thresholds. The monitoring of 1308 may be performed by conventional monitoring circuitry used in testing the SRAM cells, and thus is not discussed further.

In some embodiments, thresholds used in the performance criteria of 1308 may include temperature-related performance criteria associated with different activated states. The temperature-related performance criteria used at 1308 may be different for different activated states. For example, the performance criteria used for an activated state associated with a first low temperature condition may be different from performance criteria used for an activated state associated with a second low temperature condition, or an activated state associated with a high temperature condition.

If it is determined at 1308 that the performance criteria are not met, a criteria fail may be reported at 1310. Reporting at 1308 may include sending an electronic message indicative of the errors, providing a visual indicator of the errors for display on a computer monitor or touchscreen or printout, causing an audible tone or message, storing an indicator of the errors in a memory, and/or any other suitable reporting technique.

If it is determined at 1308 that the performance criteria are met, a past may be reported at 1312. Reporting at 1312 may include sending electronic message indicative of the errors or the "pass," providing a visual indicator on a computer monitor or touchscreen or printout, causing an audible tone or message, storing an indicator of the errors or the "pass" in a memory, and/or any other suitable reporting technique. The process 1300 may then end.

In some embodiments the performance criteria evaluation and subsequent reporting of 1308, 1310 and 1312 may not be performed. Instead, the SRAM accesses of 1306 may be monitored and analyzed to understand the performance of the SRAM cell 102 when the test circuitry 106 is in the activated state (e.g., to generate a model of the SRAM cell 102 when the test circuitry 106 is in the activated state).

Figure 14:
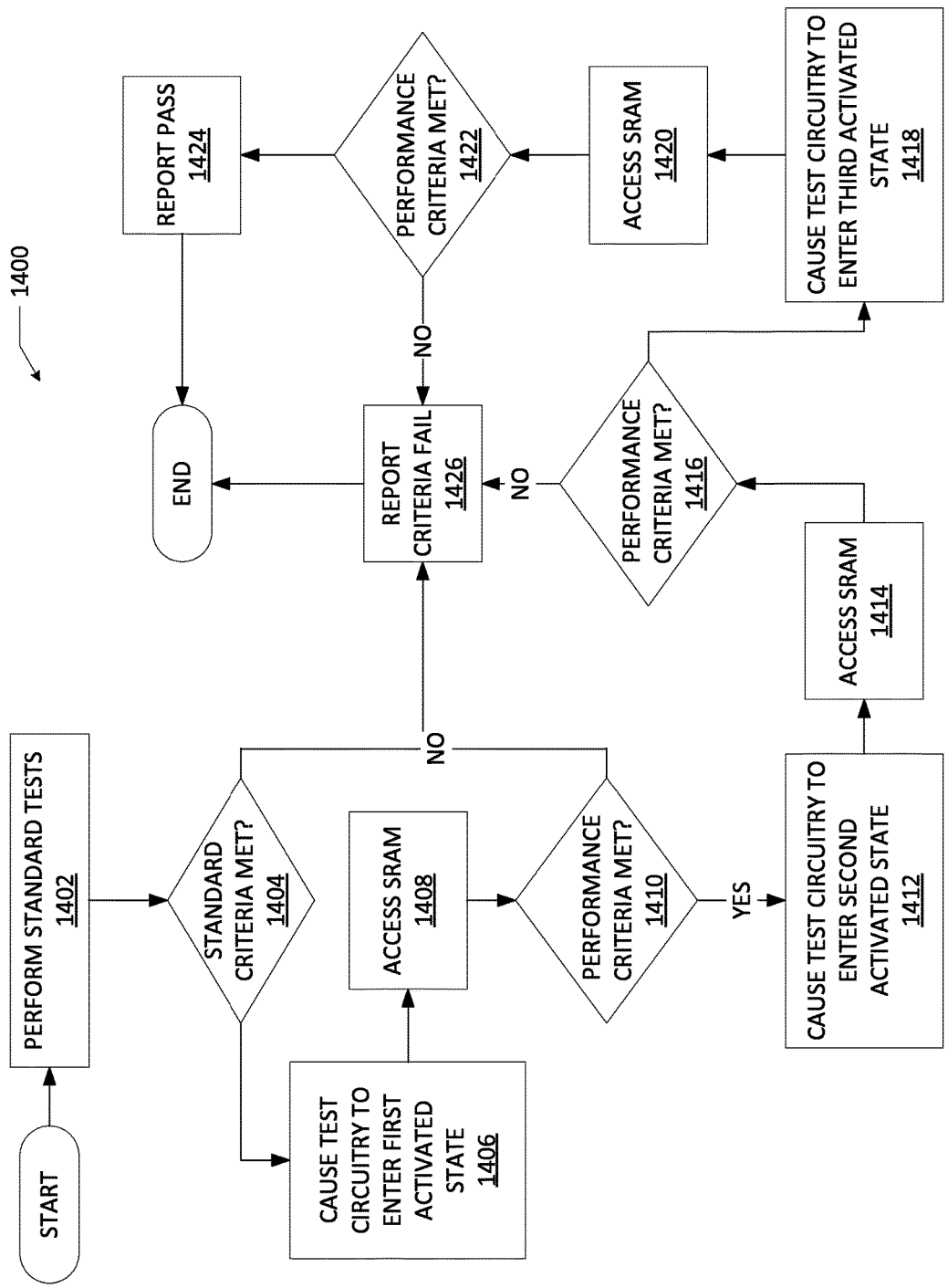
FIG. 14 is a flow diagram of an illustrative process for operating a DFT apparatus under a series of activated states, in accordance with various embodiments.

In some embodiments of the DFT apparatuses and techniques disclosed herein, an SRAM cell may be tested by performing SRAM accesses under two or more different activated states of test circuitry performed in series. The SRAM cell may "pass" this series of tests if the performance of the SRAM cell under each of the activated states is satisfactory. Any of the activated states disclosed herein may be included in a series of tests. FIG. 14 is a flow diagram of an illustrative process 1400 for operating a DFT apparatus under a series of activated states, in accordance with various embodiments. The process 1400 may be an embodiment of 1304-1312 of the process 1300 illustrated in FIG. 13 and discussed above. Although examples of the process 1400 are described below with reference to particular activated states arranged in a particular order, any desired states or arrangement may be used.

The process 1400 may begin at 1402, at which one or more standard tests may be performed. The standard tests may include any test conventional in the art for testing the performance of the SRAM cell 102, and are not discussed further herein. In some embodiments, the standard tests of 1402 may not be performed, and instead, the process 1400 may begin at 1406 (discussed below). In some embodiments, one or more standard tests may be performed after some or all of the testing methodologies described herein (e.g., those discussed below with reference to 1410, 1416 and 1422). Thus, in some embodiments, the DFT apparatuses and techniques disclosed herein may be used in conjunction with existing testing methodologies during a testing phase.

At 1404, the results of the standard tests of 1402 may be evaluated to determine whether or not standard test criteria have been met. These test criteria may be performance-related criteria determined in accordance with the intended application of the SRAM cell 102, and are not discussed further herein. If it is determined at 1404 that the standard test criteria have not been met, a criteria fail may be reported at 1426. The criteria fail of 1426 may indicate which criteria were not met, and may provide data about the performance of the SRAM cell 102 during the standard tests of 1402.

If it is determined at 1404 that the standard test criteria have been met, the process 1400 may proceed to 1406, at which the test circuitry 106 of the DFT apparatus 100 may be caused to enter a first activated state. In some embodiments, the first activated state of the test circuitry 106 of 1406 may be the activated state A, the activated state B, or the activated state D, discussed above. In some embodiments, the first activated state of 1406 may be the activated state D, and stability fails may be the primary phenomenon of interest. Causing the DFT apparatus 100 to enter the first activated state at 1406 may be performed in accordance with any of the embodiments discussed above with reference to 1304 of the process 1300 (FIG. 13), for example.

At 1408, the R/W/decoder circuitry 104 may be operated to perform accesses on the SRAM cell 102 while the test circuitry 106 is in the first activated state of 1406. Accessing the SRAM cell 102 at 1408 may be performed in accordance with any of the embodiments discussed above with reference to 1304 of the process 1300 (FIG. 13).

At 1410, the SRAM accesses of 1408 may be compared to performance criteria to determine if the performance criteria are met. Comparing the SRAM accesses of 1408 to performance criteria at 1410 may be performed in accordance with any of the embodiments discussed above with reference to 1306 of the process 1300 (FIG. 13), for example. The performance criteria of 1410 may be specific to the first activated state (1406). For example, in some embodiments, the performance criteria of 1410 may be temperature-related performance criteria that specify whether or not the SRAM cell 102 is likely to perform adequately under various desired temperature conditions based on simulated conditions provided when the test circuitry 106 is in the first activated state.

If it is determined at 1410 that the performance criteria are not met, a criteria failure may be reported at 1426. Criteria failure reporting at 1426 may be performed in accordance with any of the embodiments discussed above with reference to 1310 of the process 1300 (FIG. 13), for example.

If it is determined at 1410 that the performance criteria are met, the process 1400 may proceed to 1412, at which the test circuitry 106 of the DFT apparatus 100 may be caused to enter a second activated state, different from the first activated state of 1406. In some embodiments, the second activated state of the test circuitry 106 of 1412 may be the activated state A, the activated state B, or the activated state D, discussed above. In some embodiments, the second activated state of 1412 may be the activated state A, and write fails may be the primary phenomenon of interest. Causing the DFT apparatus 100 to enter the second activated state at 1412 may be performed in accordance with any of the embodiments discussed above with reference to 1304 of the process 1300 (FIG. 13), for example.

At 1414, the R/W/decoder circuitry 104 may be operated to perform SRAM accesses while the test circuitry 106 is in the second activated state of 1412. Accessing the SRAM cell 102 at 1412 may be performed in accordance with any of the embodiments discussed above with reference to 1304 of the process 1300 (FIG. 13), for example.

At 1416, the SRAM accesses of 1414 may be compared to performance criteria to determine if the performance criteria are met. Comparing the SRAM accesses of 1414 to performance criteria at 1416 may be performed in accordance with any of the embodiments discussed above with reference to 1306 of the process 1300 (FIG. 13), for example. The performance criteria of 1416 may be specific to the second activated state (1412). For example, in some embodiments, the performance criteria of 1410 may be temperature-related performance criteria that specify whether or not the SRAM cell 102 is likely to perform adequately under various desired temperature conditions based on simulated conditions provided when the test circuitry 106 is in the second activated state.

If it is determined at 1416 that the performance criteria are not met, a criteria failure may be reported at 1426. As noted above, criteria failure reporting at 1426 may be performed in accordance with any of the embodiments discussed above with reference to 1310 of the process 1300 (FIG. 13), for example.

If it is determined at 1416 that the performance criteria are met, the process 1400 may proceed to 1418, at which the test circuitry 106 of the DFT apparatus 100 may be caused to enter a third activated state, different from the first and second activated states of 1406 and 1412, respectively. In some embodiments, the third activated state of the test circuitry 106 of 1412 may be the activated state A, the activated state B, or the activated state D, discussed above. In some embodiments, the third activated state of 1418 may be the activated state B, and write fails may be the primary phenomenon of interest. Causing the DFT apparatus 100 to enter the first activated state at 1406 may be performed in accordance with any of the embodiments discussed above with reference to 1304 of the process 1300 (FIG. 13), for example.

At 1420, the R/W/decoder circuitry 104 may be operated to perform accesses on the SRAM cell 102 while the test circuitry 106 is in the third activated state of 1418. Accessing the SRAM cell 102 at 1418 may be performed in accordance with any of the embodiments discussed above with reference to 1304 of the process 1300 (FIG. 13), for example.

At 1422, the SRAM accesses of 1420 may be compared to performance criteria to determine if the performance criteria are met. Comparing the SRAM accesses of 1420 to performance criteria at 1422 may be performed in accordance with any of the embodiments discussed above with reference to 1306 of the process 1300 (FIG. 13), for example. The performance criteria of 1422 may be specific to the third activated state (1420). For example, in some embodiments, the performance criteria of 1422 may be temperature-related performance criteria that specify whether or not the SRAM cell 102 is likely to perform adequately under various desired temperature conditions based on simulated conditions provided when the test circuitry 106 is in the third activated state.

If it is determined at 1422 that the performance criteria are not met, a criteria failure may be reported at 1426. As noted above, criteria failure reporting at 1426 may be performed in accordance with any of the embodiments discussed above with reference to 1310 of the process 1300 (FIG. 13), for example.

If it is determined at 1422 that the performance criteria are met, the SRAM cell 102 may be reported as a "pass" at 1424. Reporting at 1424 may be performed in accordance with any of the embodiments discussed above with reference to 1312 of the process 1300 (FIG. 13). For example, in some embodiments, the errors detected and/or an indicator that the errors do not exceed the threshold may be reported at 1424. The process 1400 may then end.

The examples and arrangements of activated states in the process 1400 are simply illustrative; additional activated states may be used, some activated states may be omitted, and activated states may be re-arranged. The arrangement of testing under different activated states may be selected so as to first test the SRAM cell 102 under simulated conditions in which the SRAM cell 102 is most likely to fail, then test the SRAM cell 102 under simulated conditions in which the SRAM cell 102 is less likely to fail. This may optimize the consumption of testing resources by weeding out the most likely failures early on. In some embodiments, an SRAM cell 102 baby most likely to fail under the simulated conditions corresponding to activated state D, and less likely to fail under the simulated conditions corresponding to activated states A or B.

In some embodiments, the process 1400 may include causing the test circuitry 106 to enter the activated state C discussed above with reference to FIGS. 10-12, monitoring SRAM accesses while the test circuitry 106 is in the activated state C, and detecting errors based on the monitoring. In some embodiments, the use of activated state C may precede analysis of the performance of the SRAM cell 102 when the test circuitry 106 is in other activated states (e.g., the activated states A, B or D). Activated state C may simulate the operation of the SRAM cell 102 under high temperature conditions, and may be particularly useful for evaluating stability fails.

In some embodiments of the processes 1300 and 1400 (FIGS. 13 and 14, respectively), repair operations may be attempted after errors are detected but before a device is identified as "pass" or "fail." Repair operations may be attempted during and/or after monitoring for errors, and/or after determining that detected errors exceed a performance threshold. In embodiments in which multiple activated states are used to perform multiple tests, repair operations may be attempted during and/or after each test. A device may only fail if both a threshold number of errors are detected and attempted repairs are unsuccessful or cannot be made.

In some embodiments, different performance thresholds may be associated with different applications for SRAM devices. For example, in some embodiments, a certain percentage of SRAM cells must pass under high temperature conditions in order to satisfy the performance requirements of a first application, but a second lesser percentage of SRAM cells must pass in order to satisfy the performance requirements of a second application. In such embodiments, and SRAM device that fails to meet the performance requirements of the first application may still meet the performance requirements of the second application. Such an SRAM device may be reported as a "fail" with respect to the first application but as a "pass" with respect to the second application. The analysis of multiple sets of performance thresholds for any particular test may be performed in parallel. In some embodiments, SRAM devices may be sorted into different categories based on their performance under various simulated conditions. For example, as an SRAM device is analyzed through the process 1400 of FIG. 14, the performance of the SRAM device under each different activated state may be monitored and recorded, and the SRAM device may be categorized according to the performance results. SRAM devices so categorized may be later assigned for different applications whose performance requirements are consistent with the category.

As noted above, in some embodiments, accesses to the SRAM cell 102 may be performed with the test circuitry 106 in various activated states in order to analyze the performance of the SRAM cell 102 and generate models of its behavior. In some embodiments, different activated states of the test circuitry 106 may result in behavior of the SRAM cell 102 that is very similar to behavior of the SRAM cell 102 under different environmental conditions. In particular, as discussed above, a number of the activated states of the test circuitry 106 disclosed herein may result in behavior of the SRAM cell 102 that is similar to the behavior of the SRAM cell 102 under different temperature conditions. Consequently, monitoring the behavior of the SRAM cell 102 under various activated states of the test circuitry 106 may simulate the behavior of the SRAM cell 102 under these different environmental (e.g., temperature) conditions.

Figure 15:
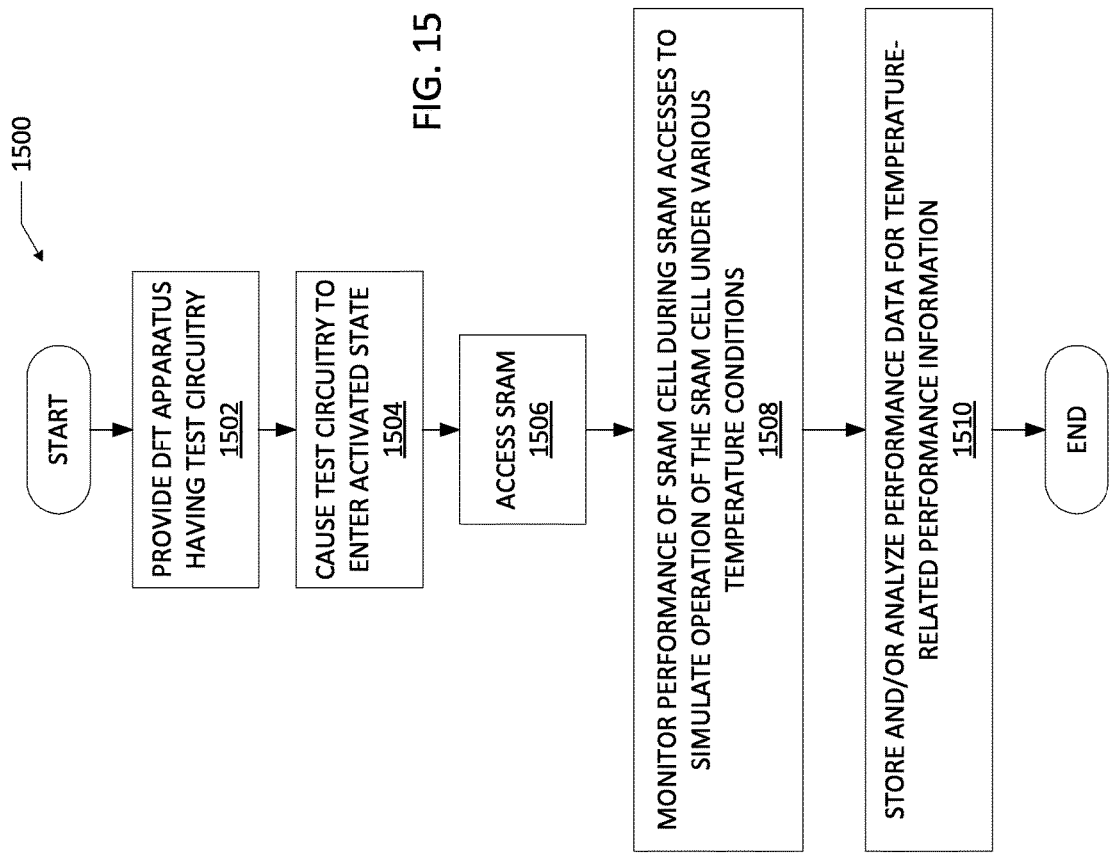
FIG. 15 is a flow diagram of an illustrative process for simulating operation of a static random access memory (SRAM) SRAM cell under predetermined temperature conditions, in accordance with various embodiments.

FIG. 15 is a flow diagram of an illustrative process 1500 for simulating operation of an SRAM cell under predetermined temperature conditions, in accordance with various embodiments.

The process 1500 may begin at 1502, at which the DFT apparatus 100 may be provided. The DFT apparatus 100 provided at 1502 may include an SRAM cell 102, the R/W/decoder circuitry 104, and the test circuitry 106 (coupled to the SRAM cell 102 and the R/W/decoder circuitry 104), and may also include the power supply circuitry 118, as discussed above. In some embodiments, the DFT apparatus 100 may be provided by coupling the power supply circuitry 118 to a power source.

At 1504, the test circuitry 106 of the DFT apparatus 100 may be caused to enter an activated state. In some embodiments, the activated state of the test circuitry 106 of 1504 may be the activated state A, the activated state B, or the activated state D, discussed above. Causing the DFT apparatus 100 to enter the activated state at 1504 may be performed in accordance with any of the embodiments discussed above with reference to 1304 of the process 1300 (FIG. 13), for example.

At 1506, the R/W/decoder circuitry 104 may be operated to perform accesses to the SRAM cell 102 while the test circuitry 106 is in the activated state of 1504. SRAM accesses at 1506 may be performed in accordance with any of the embodiments discussed above with reference to 1306 of the process 1300 (FIG. 13).

At 1508, the performance of the SRAM cell 102 may be monitored during the SRAM accesses (1506) to simulate operation of the SRAM cell 102 under a temperature condition corresponding to the activated state (1504). For example, as discussed above, monitoring the performance of the SRAM cell 102 when the test circuitry 106 is in the activated state A may simulate operation of the SRAM cell 102 when the SRAM cell 102 is under low temperature conditions. Monitoring the performance of the SRAM cell 102 when the test circuitry 106 is in the activated state B may simulate operation of the SRAM cell 102 when the SRAM cell 102 is under low temperature conditions. Monitoring the performance of the SRAM cell 102 when the test circuitry 106 is in the activated state D may simulate operation of the SRAM cell 102 when the SRAM cell 102 is under high temperature conditions. The monitoring of 1508 may generate performance related data.

At 1510, the data generated at 1508 may be stored in a memory device (e.g., a memory device of a computing device performing the monitoring of 1508) and/or analyzed (e.g., by a computing device) for temperature-related performance information. In some embodiments, the data may be analyzed to generate a model of the behavior of the SRAM cell 102 under different temperature conditions. In some embodiments, the data generated at 1508 may be analyzed to determine which environmental conditions are most appropriately simulated by performing accesses to the SRAM cell 102 under the activated state (1504). Any of a number of different types of analysis may be performed using the data generated at 1508. The process 1500 may then end.

Figure 16:
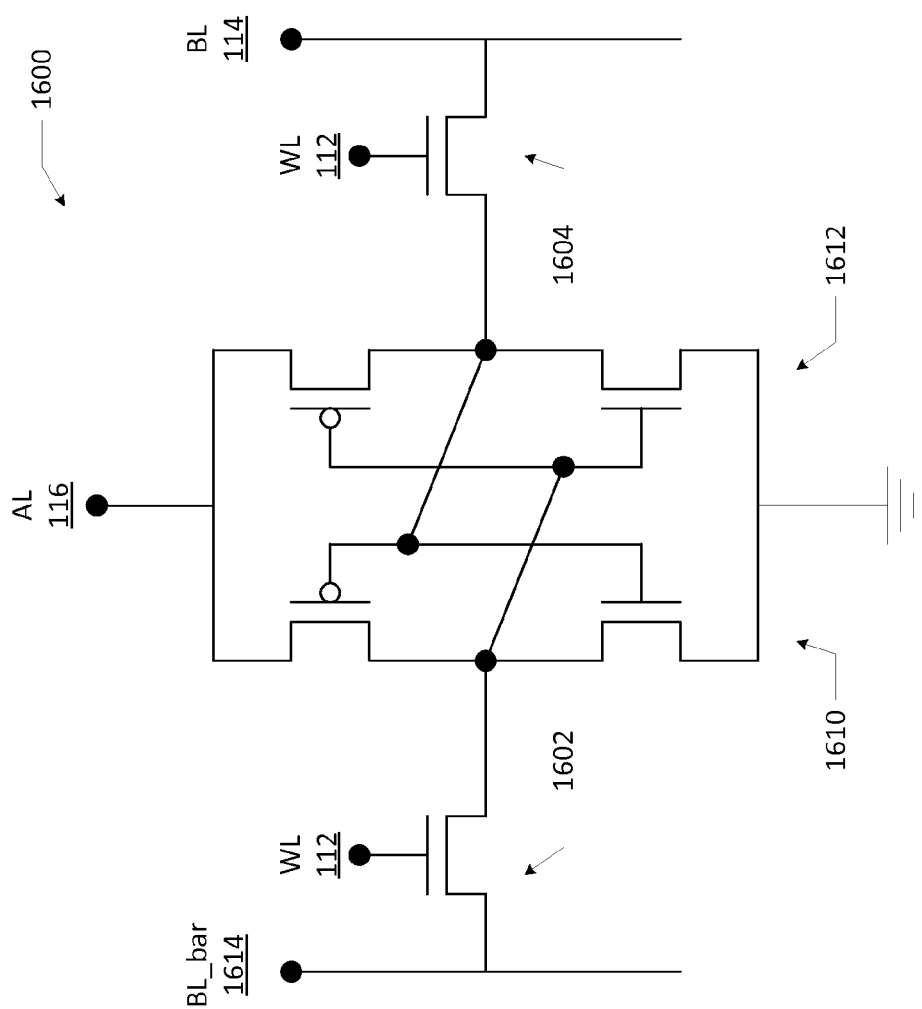
FIG. 16 is a circuit schematic of an SRAM cell that may be included in a DFT apparatus, in accordance with various embodiments.

FIG. 16 is a circuit schematic of an SRAM cell 1600 that may be used as the SRAM cell 102, in accordance with various embodiments. The SRAM cell 1600 is a 6 transistor SRAM cell, but this embodiment is simply illustrative; SRAM cells including any suitable number of transistors arranged in any suitable configuration may be used with the apparatuses and techniques disclosed herein. As noted above, the DFT apparatus 100 may include one or more SRAM cells (e.g., SRAM cells configured as the SRAM cell 1600). The SRAM cell 102 may include two cross-coupled inverters 1610 and 1612 and two access transistors 1602 and 1604. The WL 112, the BL 114, and the AL 116 may be arranged as shown with reference to the inverters 1610 and 1612 and the transistors 1602 and 1604. The SRAM cell 1600 may include an inverse bit line BL_bar 1614, which may receive a signal that is inverse to the signal applied to the BL 114. R/W operations on the SRAM cell 102 are conventional (e.g., as discussed above with reference to FIG. 2A), and are not discussed further.

The following paragraphs describe illustrative embodiments of the apparatuses and techniques disclosed herein.

Example 1 is an apparatus including: an SRAM cell comprising a WL to receive an applied WL voltage and a BL to receive an applied BL voltage; R/W/decoder circuitry to selectively provide first and second WL voltages for application to the WL, and selectively provide first and second BL voltages for application to the BL, wherein the first WL voltage is greater than the second WL voltage and the first BL voltage is greater than the second BL voltage; and test circuitry, coupled to the SRAM cell and the R/W/decoder circuitry, having an activated state and a deactivated state. When the test circuitry is in the deactivated state: when the R/W/decoder circuitry provides the first WL voltage, the applied WL voltage is the first WL voltage, and when the R/W/decoder circuitry provides the second BL voltage, the applied BL voltage is the second BL voltage. When the test circuitry is in the activated state: when the R/W/decoder circuitry provides the first WL voltage, the applied WL voltage is less than the first WL voltage; or when the R/W/decoder circuitry provides the second BL voltage, the applied BL voltage is greater than the second BL voltage.

Example 2 may include the subject matter of Example 1, and may further include power supply circuitry to provide a supply voltage. The SRAM cell may include an array line to receive an applied array line voltage, the test circuitry may be coupled to the power supply circuitry. When the test circuitry is in the deactivated state, the applied array line voltage is the supply voltage. When the test circuitry is in the activated state, the applied array line voltage is less than the supply voltage.

Example 3 may include the subject matter of Example 2, and may further specify that when the test circuitry is in the activated state and when the R/W/decoder circuitry provides the first WL voltage, the applied WL voltage is less than the first WL voltage.

Example 4 may include the subject matter of Example 3, and may further specify that when the test circuitry is in the activated state, the applied array line voltage is between 0.05 volts and 0.15 volts less than the supply voltage.

Example 5 may include the subject matter of Example 3, and may further specify that when the test circuitry is in the activated state and when the R/W/decoder circuitry provides the first WL voltage, the applied WL voltage is between 0.01 volts and 0.1 volts less than the first WL voltage.

Example 6 may include the subject matter of Example 2, and may further specify that the test circuitry includes a transistor coupled between ground and a power switch of the power supply circuitry.

Example 7 may include the subject matter of Example 1, and may further specify that when the test circuitry is in the activated state and when the R/W/decoder circuitry provides the second BL voltage, the applied BL voltage is between 0.01 volts and 0.15 volts greater than the second BL voltage.

Example 8 may include the subject matter of Example 1, and may further specify that: when the test circuitry is in the activated state and when the R/W/decoder circuitry provides the first WL voltage, the applied WL voltage is less than the first WL voltage; and the test circuitry includes a transistor coupled between ground and a WL buffer output of the R/W/decoder circuitry.

Example 9 may include the subject matter of Example 1, and may further specify that: when the test circuitry is in the activated state and when the R/W/decoder circuitry provides the second BL voltage, the applied BL voltage is greater than the second BL voltage; and the test circuitry includes a transistor coupled between a write buffer input and a supply voltage provided by power supply circuitry.

Example 10 is a method of operating a DFT device, including providing a DFT device including: an SRAM cell comprising a WL to receive an applied WL voltage and a BL to receive an applied BL voltage; R/W/decoder circuitry to selectively provide first and second WL voltages for application to the WL during accesses, and selectively provide first and second BL voltages for application to the BL during accesses, wherein the first WL voltage is greater than the second WL voltage and the first BL voltage is greater than the second BL voltage; and test circuitry, coupled to the SRAM cell and the R/W/decoder circuitry, having an activated state and a deactivated state. The method may also include causing the test circuitry to enter the activated state, in which: when the R/W/decoder circuitry provides the first WL voltage, the applied WL voltage is less than the first WL voltage, or when the R/W/decoder circuitry provides the second BL voltage, the applied BL voltage is greater than the second BL voltage. The method may also include operating the R/W/decoder circuitry to perform accesses to the SRAM cell while the test circuitry is in the activated state.

Example 11 may include the subject matter of Example 10, and may further include monitoring for errors in the accesses performed while the test circuitry is in the activated state.

Example 12 may include the subject matter of Example 10, and may further specify that: the DFT device further comprises power supply circuitry to provide a supply voltage; the SRAM cell comprises an array line to receive an applied array line voltage; the test circuitry is coupled to the power supply circuitry; and in the activated state, when the R/W/decoder circuitry provides the first WL voltage, the applied WL voltage is less than the first WL voltage, and the applied array line voltage is less than the supply voltage.

Example 13 may include the subject matter of Example 12, and may further specify that the activated state is a first activated state and the test circuitry has a second activated state. The method may also include: causing the test circuitry to enter the second activated state, in which, when the R/W/decoder circuitry provides the first WL voltage, the applied WL voltage is less than the first WL voltage, and the applied array line voltage is the supply voltage; and operating the R/W/decoder circuitry to perform accesses to the SRAM cell while the test circuitry is in the second activated state.

Example 14 may include the subject matter of Example 13, and may further include monitoring for errors in the accesses performed while the test circuitry is in the second activated state.

Example 15 may include the subject matter of Example 13, and may further specify that causing the test circuitry to enter the first activated state is performed prior to causing the test circuitry to enter the second activated state.

Example 16 may include the subject matter of Example 12, and may further specify that the activated state is a first activated state and the test circuitry has a second activated state. The method may also include: causing the test circuitry to enter the second activated state, in which, when the R/W/decoder circuitry provides the second BL voltage, the applied BL voltage is greater than the second BL voltage; and operating the R/W/decoder circuitry to perform accesses to the SRAM cell while the test circuitry is in the second activated state.

Example 17 may include the subject matter of Example 16, and may further include monitoring for errors in the accesses performed while the test circuitry is in the second activated state.

Example 18 may include the subject matter of Example 16, and may further specify that causing the test circuitry to enter the first activated state is performed prior to causing the test circuitry to enter the second activated state.

Example 19 may include the subject matter of Example 10, and may further include, after monitoring for errors in the accesses performed while the test circuitry is in the activated state, determining whether the SRAM cell may be repaired.

Example 20 is a method of simulating operation of an SRAM cell under pre-determined temperature conditions, including providing a DFT apparatus including: the SRAM cell, including a WL to receive an applied WL voltage and a BL to receive an applied BL voltage; R/W/decoder circuitry to selectively provide first and second WL voltages for application to the WL during accesses, and selectively provide first and second BL voltages for application to the BL during accesses; power supply circuitry to provide a supply voltage; and test circuitry, coupled to the SRAM cell and the R/W/decoder circuitry and the power supply circuitry, having first and second activated states and a deactivated state. The method may also include causing the test circuitry to enter the first or second activated state, wherein: in the first activated state, when the R/W/decoder circuitry provides the first WL voltage, the applied WL voltage is less than the first WL voltage and the applied array line voltage is less than the supply voltage; in the second activated state, (1) when the R/W/decoder circuitry provides the first WL voltage, the applied WL voltage is less than the first WL voltage and the applied array line voltage is the supply voltage, or (2) when the R/W/decoder circuitry provides the second BL voltage, the applied BL voltage is greater than the second BL voltage. The method may also include operating the R/W/decoder circuitry to perform accesses to the SRAM cell while the test circuitry is in the first or second activated states, wherein: while the test circuitry is in the first activated state, operating the R/W/decoder circuitry simulates operation of the SRAM cell under temperature conditions greater than room temperature; and while the test circuitry is in the second and state, operating the R/W/decoder circuitry simulates operation of the SRAM cell under temperature conditions less than room temperature.

Example 21 may include the subject matter of Example 20, and may further specify that causing the test circuitry to enter the first or second activated state includes causing the test circuitry to enter the second activated state, and wherein the test circuitry further has a third activated state. The method may further include, prior to causing the test circuitry to enter the second activated state: causing the test circuitry to enter the third activated state, in which, when the R/W/decoder circuitry provides the first WL voltage, the applied WL voltage is the first WL voltage, and the applied array line voltage is less than the supply voltage, and operating the R/W/decoder circuitry to perform accesses to the SRAM cell while the test circuitry is in the third activated state to simulate operations of the SRAM cell under temperature conditions greater than room temperature.

Example 22 may include the subject matter of Example 20, and may further specify that causing the test circuitry to enter the first or second activated state includes causing the test circuitry to enter the first activated state. The method may further include, after operating the R/W/decoder circuitry to perform accesses to the SRAM cell while the test circuitry is in the first activated state, causing the test circuitry to enter the second activated state; and operating the R/W/decoder circuitry to perform accesses to the SRAM cell while the test circuitry is in the second activated state.

Example 23 may include the subject matter of Example 20, and may further specify that, in the second activated state, when the R/W/decoder circuitry provides the first WL voltage, the applied WL voltage is less than the first WL voltage and the applied array line voltage is the supply voltage.

Example 24 may include the subject matter of Example 20, and may further specify that in the second activated state, when the read/write/decoder circuitry provides the second BL voltage, the applied voltage is greater than the second BL voltage.

Example 25 is an apparatus comprising means for performing the method of any of Examples 10-24.

Example 26 is one or more computer readable media which, when executed by one or more processing devices of a computing device, cause the computing device to perform the method of any of Examples 10-24.

What is claimed is:

1. An apparatus, comprising:
a static random access memory (SRAM) cell comprising
  a word line (WL) to receive an applied WL voltage and
  a bit line (BL) to receive an applied BL voltage;
read/write/decoder circuitry to selectively provide first and second WL voltages for application to the WL, and selectively provide first and second BL voltages for application to the BL, wherein the first WL voltage is greater than the second WL voltage and the first BL voltage is greater than the second BL voltage; and
test circuitry coupled to the SRAM cell and the read/write/decoder circuitry, the test circuitry having an activated state and a deactivated state,
wherein, when the test circuitry is in the activated state, the read/write/decoder circuitry is to simulate operation of the SRAM cell under low temperature conditions that are less than approximately 25 degrees Celsius.

2. The apparatus of claim 1, further comprising:
power supply circuitry to provide a supply voltage;
wherein:
  the SRAM cell comprises an array line to receive an applied array line voltage,
  the test circuitry is coupled to the power supply circuitry,
  when the test circuitry is in the deactivated state, the applied array line voltage is the supply voltage, and
  when the test circuitry is in the activated state, the applied array line voltage is less than the supply voltage.

3. The apparatus of claim 2, wherein:
when the test circuitry is in the deactivated state:
  when the read/write/decoder circuitry provides the first WL voltage, the applied WL voltage is the first WL voltage, and
  when the read/write/decoder circuitry provides the second BL voltage, the applied BL voltage is the second BL voltage;
when the test circuitry is in the activated state:
  when the read/write/decoder circuitry provides the first WL voltage, the applied WL voltage is less than the first WL voltage, or
  when the read/write/decoder circuitry provides the second BL voltage, the applied BL voltage is greater than the second BL voltage; and when the test circuitry is in the activated state and when the read/write/decoder circuitry provides the first WL voltage, the applied WL voltage is less than the first WL voltage.

4. The apparatus of claim 3, wherein when the test circuitry is in the activated state, the applied array line voltage is between 0.05 volts and 0.15 volts less than the supply voltage.

5. The apparatus of claim 3, wherein when the test circuitry is in the activated state and when the read/write/decoder circuitry provides the first WL voltage, the applied WL voltage is between 0.01 volts and 0.1 volts less than the first WL voltage.

6. The apparatus of claim 2, wherein the test circuitry comprises a transistor coupled between ground and a power switch of the power supply circuitry.

7. The apparatus of claim 3, wherein when the test circuitry is in the activated state and when the read/write/decoder circuitry provides the second BL voltage, the applied BL voltage is between 0.01 volts and 0.15 volts greater than the second BL voltage.

8. The apparatus of claim 3, wherein:
when the test circuitry is in the activated state and when the read/write/decoder circuitry provides the first WL voltage, the applied WL voltage is less than the first WL voltage; and
the test circuitry comprises a transistor coupled between ground and a WL buffer output of the read/write/decoder circuitry.

9. The apparatus of claim 3, wherein:
when the test circuitry is in the activated state and when the read/write/decoder circuitry provides the second BL voltage, the applied BL voltage is greater than the second BL voltage; and
the test circuitry comprises a transistor coupled between a write buffer input and a supply voltage provided by power supply circuitry.

10. The apparatus of claim 1, wherein the activated state is a first activated state and the test circuitry has a second activated state, and when the test circuitry is in the activated state, the read/write/decoder circuitry is to simulate operation of the SRAM cell under high temperature conditions that are greater than approximately 25 degrees Celsius.

11. The apparatus of claim 10, wherein the low temperature conditions are based on a threshold mismatch profile of an SRAM cell operating at approximately −30 degrees Celsius, and the high temperature conditions are based on a threshold mismatch profile of an SRAM cell operating at approximately 125 degrees Celsius.

12. A method of operating a design-for-test (DFT) device, comprising:
providing the DFT device, the DFT device comprising:
  a static random access memory (SRAM) cell comprising
    a word line (WL) to receive an applied WL voltage and
    a bit line (BL) to receive an applied BL voltage,
  read/write/decoder circuitry to selectively provide first and second WL voltages for application to the WL during accesses, and selectively provide first and second BL voltages for application to the BL during accesses, wherein the first WL voltage is greater than the second WL voltage and the first BL voltage is greater than the second BL voltage, and
  test circuitry, coupled to the SRAM cell and the read/write/decoder circuitry, having an activated state and a deactivated state;
causing the test circuitry to enter the activated state, in which:

when the read/write/decoder circuitry provides the first WL voltage, the applied WL voltage is less than the first WL voltage, or when the read/write/decoder circuitry provides the second BL voltage, the applied BL voltage is greater than the second BL voltage; and operating the read/write/decoder circuitry to perform accesses to the SRAM cell while the test circuitry is in the activated state, wherein the accesses simulate operation of the SRAM cell at a low temperature that is less than approximately 25 degrees Celsius.

13. The method of claim 12, further comprising:
monitoring for errors in the accesses performed while the test circuitry is in the activated state.

14. The method of claim 12, wherein:
the DFT device further comprises power supply circuitry to provide a supply voltage;
the SRAM cell comprises an array line to receive an applied array line voltage;
the test circuitry is coupled to the power supply circuitry; and
in the activated state, when the read/write/decoder circuitry provides the first WL voltage, the applied WL voltage is less than the first WL voltage, and the applied array line voltage is less than the supply voltage.

15. The method of claim 14, wherein the activated state is a first activated state and the test circuitry has a second activated state, and the method further comprises:
causing the test circuitry to enter the second activated state, in which, when the read/write/decoder circuitry provides the first WL voltage, the applied WL voltage is less than the first WL voltage, and the applied array line voltage is the supply voltage; and
operating the read/write/decoder circuitry to perform accesses to the SRAM cell while the test circuitry is in the second activated state.

16. The method of claim 15, further comprising:
monitoring for errors in the accesses performed while the test circuitry is in the second activated state.

17. The method of claim 15, wherein causing the test circuitry to enter the first activated state is performed prior to causing the test circuitry to enter the second activated state.

18. The method of claim 14, wherein the activated state is a first activated state and the test circuitry has a second activated state, and the method further comprises:
causing the test circuitry to enter the second activated state, in which, when the read/write/decoder circuitry provides the second BL voltage, the applied BL voltage is greater than the second BL voltage; and
operating the read/write/decoder circuitry to perform accesses to the SRAM cell while the test circuitry is in the second activated state.

19. The method of claim 18, further comprising:
monitoring for errors in the accesses performed while the test circuitry is in the second activated state.

20. The method of claim 18, wherein causing the test circuitry to enter the first activated state is performed prior to causing the test circuitry to enter the second activated state.

21. The method of claim 12, further comprising:
after monitoring for errors in the accesses performed while the test circuitry is in the activated state, determining whether the SRAM cell may be repaired.

22. The method of claim 14, wherein the activated state is a first activated state and the test circuitry has a second activated state, and the method further comprises:

causing the test circuitry to enter the second activated state, in which, when the read/write/decoder circuitry provides the first WL voltage, the applied WL voltage is less than the first WL voltage, and the applied array line voltage is less than the supply voltage; and operating the read/write/decoder circuitry to perform accesses to the SRAM cell while the test circuitry is in the second activated state, wherein when the test circuitry is in the second activated state the accesses simulate operation of the SRAM cell at a high temperature that is greater than approximately 25 degrees Celsius.

23. The method of claim 22, wherein the low temperature is approximately −30 degrees Celsius, and the high temperature is approximately 125 degrees Celsius.

24. A design-for-test (DFT) apparatus, the DFT apparatus comprising:
a static random access memory (SRAM) cell, comprising a word line (WL) to receive an applied WL voltage and a bit line (BL) to receive an applied BL voltage;
read/write/decoder circuitry to selectively provide first and second WL voltages for application to the WL during accesses, and selectively provide first and second BL voltages for application to the BL during accesses;
power supply circuitry to provide a supply voltage; and
test circuitry coupled to the SRAM cell and the read/write/decoder circuitry and the power supply circuitry, the test circuitry having a first activated state, a second activated state, and a deactivated state,
wherein, when the test circuitry enters the first activated state and when the read/write/decoder circuitry provides the first WL voltage, the applied WL voltage is less than the first WL voltage and an applied array line voltage is less than the supply voltage,
wherein, when the test circuitry enters the second activated state, (1) when the read/write/decoder circuitry provides the first WL voltage, the applied WL voltage is less than the first WL voltage and the applied array line voltage is the supply voltage, or (2) when the read/write/decoder circuitry provides the second BL voltage, the applied BL voltage is greater than the second BL voltage, and
wherein the read/write/decoder circuitry is to perform accesses to the SRAM cell while the test circuitry is in the first activated state or second activated state, wherein:
while the test circuitry is in the first activated state, the read/write/decoder circuitry is to simulate operation of the SRAM cell under temperature conditions greater than room temperature, and
while the test circuitry is in the second activated state, the read/write/decoder circuitry is to simulate operation of the SRAM cell under temperature conditions less than room temperature.

25. The DFT apparatus of claim 24, wherein, when the test circuitry is in the second activated state:
the applied WL voltage is less than the first WL voltage and the applied array line voltage is the supply voltage when the read/write/decoder circuitry provides the first WL voltage, and
the applied BL voltage is greater than the second BL voltage when the read/write/decoder circuitry provides the second BL voltage.

26. The DFT apparatus of claim 24, wherein the simulation of the SRAM cell under temperature conditions less than room temperature is based on a threshold mismatch profile of an SRAM cell operating at approximately −30 degrees Celsius, and the simulation of the SRAM cell under temperature conditions greater than room temperature is based on a threshold mismatch profile of an SRAM cell operating at approximately 125 degrees Celsius, and wherein room temperature is approximately 25 degrees Celsius.

* * * * *